(12) United States Patent
Hamabe

(10) Patent No.: US 11,012,166 B2
(45) Date of Patent: May 18, 2021

(54) RADIO WAVE ENVIRONMENT ANALYSIS DEVICE AND RADIO WAVE ENVIRONMENT ANALYSIS METHOD

(71) Applicant: Panasonic Intellectual Property Management Co., Ltd., Osaka (JP)

(72) Inventor: Taichi Hamabe, Kanagawa (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 17/016,972

(22) Filed: Sep. 10, 2020

(65) Prior Publication Data

US 2020/0412464 A1 Dec. 31, 2020

Related U.S. Application Data

(63) Continuation of application No. PCT/JP2019/009212, filed on Mar. 7, 2019.

(30) Foreign Application Priority Data

Mar. 12, 2018 (JP) .............................. JP2018-044719

(51) Int. Cl.
*H04B 17/309* (2015.01)
*H04B 17/12* (2015.01)
(Continued)

(52) U.S. Cl.
CPC ........... *H04B 17/309* (2015.01); *H04B 17/12* (2015.01); *H04B 17/24* (2015.01); *H04B 17/27* (2015.01); *H04B 17/391* (2015.01)

(58) Field of Classification Search
CPC .................................................. H04B 17/309
See application file for complete search history.

(56) References Cited

U.S. PATENT DOCUMENTS 6,188,356 B1* 2/2001 Kitayoshi ............... G01S 3/023
342/451
2004/0259554 A1* 12/2004 Rappaport ............ H04W 16/18
455/446
(Continued)

FOREIGN PATENT DOCUMENTS

JP 2005-072667 3/2005
JP 2006-352385 12/2006
(Continued)

OTHER PUBLICATIONS

International Search Report dated Jun. 4, 2019 in International (PCT) Application No. PCT/JP2019/009212.
(Continued)

*Primary Examiner* — Hsinchun Liao
(74) *Attorney, Agent, or Firm* — Wenderoth, Lind & Ponack, L.L.P.

(57) ABSTRACT

A radio wave environment analysis device includes: a processor configured to analyze a radio wave environment corresponding to a radio wave transmitted from a wireless transmitter arranged within an area including observation points using a scattering body having a volume of an initial value or higher; and a memory configured to store the radio wave environment at each of observation points of an area where based on the analysis. The processor is configured to: analyze the radio wave environment using a scattering body having a volume reduced by a first predetermined value, and terminate the analysis if a difference between first and second radio wave environments at each observation point based on analyses using the scattering bodies before and after reduction of the volume, respectively, is equal to or lower than a second predetermined value.

6 Claims, 17 Drawing Sheets

(51) Int. Cl.
  *H04B 17/24* (2015.01)
  *H04B 17/27* (2015.01)
  *H04B 17/391* (2015.01)

(56) References Cited

U.S. PATENT DOCUMENTS

| | | | |
|---|---|---|---|
| 2009/0239532 A1 | 9/2009 | Ebata | |
| 2010/0255803 A1* | 10/2010 | Sugahara | H04B 17/391 |
| | | | 455/226.1 |
| 2010/0291878 A1* | 11/2010 | Sato | G01S 5/0273 |
| | | | 455/67.11 |

FOREIGN PATENT DOCUMENTS

| | | |
|---|---|---|
| JP | 2010-130220 | 6/2010 |
| JP | 2010-187140 | 8/2010 |
| JP | 2016-086228 | 5/2016 |

OTHER PUBLICATIONS

Tetsuro IMAI, "Mobile Radio Propagation Simulation Based on Ray-Tracing Method", IEICE Transactions on Communications, Sep. 2009, vol. J92-B No. 9, pp. 1333-1347 with partial translation.
Written Opinion of the International Searching Authority dated Jun. 4, 2019 in International (PCT) Application No. PCT/JP2019/009212.

* cited by examiner

RADIO WAVE ATTENUATION AMOUNT IN RANGE OF 1° FROM TRANSMISSION POINT D0
= ATTENUATION AMOUNT DEPENDING ON DISTANCE (D0, RR2 (=RR1))
  + MATERIAL CONSTANT (ATTENUATION AMOUNT) OF CONCRETE STRUCTURE CC1
  + MATERIAL CONSTANT (ATTENUATION AMOUNT) OF CONCRETE STRUCTURE CC2
  + MATERIAL CONSTANT (ATTENUATION AMOUNT) OF WOOD WD1

RADIO WAVE ENVIRONMENT ANALYSIS DEVICE AND RADIO WAVE ENVIRONMENT ANALYSIS METHOD

CROSS-REFERENCE TO RELATED APPLICATIONS

This application is a continuation of PCT International Patent Application No. PCT/JP2019/009212 filed on Mar. 7, 2019, which claims the benefit of priority of Japanese Patent Application No. 2018-044719 filed on Mar. 12, 2018, the enter contents of which are incorporated herein by reference.

FIELD

The present disclosure relates to a radio wave environment analysis device and a radio wave environment analysis method.

BACKGROUND

JP-A-2006-352385 discloses a method in which an area to be estimated is divided into minute sections, and reception quality from a plurality of installed base stations is grasped in each minute section. JP-A-2006-352385 discloses a method of estimating an area in which a handover occurs by detecting a handover condition with reference to a difference between the reception quality of a minute section and the reception quality of another minute section adjacent to the minute section.

SUMMARY

The present disclosure has been made in view of the related-art circumstances described above, and an object thereof is to provide a radio wave environment analysis device and a radio wave environment analysis method that assist in efficiently analyzing a radio wave environment for a wide area and visualizing the radio wave environment at a higher speed.

The present disclosure provides a radio wave environment analysis device configured to analyze a radio wave environment corresponding to a radio wave transmitted from a wireless transmitter arranged within an area including a plurality of observation points, the radio wave environment analysis device including: a processor configured to analyze the radio wave environment using a scattering body having a volume of an initial value or higher; and a memory configured to store the radio wave environment at each of the plurality of observation points based on the analysis, wherein the processor is configured to: analyze the radio wave environment using a scattering body having a volume reduced by a first predetermined value, and terminate the analysis of the radio environment if a difference between a first radio wave environment at each of the plurality of observation points and a second radio wave environment at each of the plurality of observation points is equal to or lower than a second predetermined value, the first radio wave environment obtained based on an analysis using the scattering body before the volume is reduced, the second radio wave environment obtained based on an analysis using the scattering body after the volume.

The present disclosure provides a radio wave environment analysis method to be performed in a radio wave environment analysis device configured to analyze a radio wave environment corresponding to a radio wave transmitted from a wireless transmitter arranged within an area including a plurality of observation points, the radio wave environment analysis method including: analyzing the radio wave environment using a scattering body having a volume of an initial value or higher; storing the radio wave environment at each of the plurality of observation points based on the analysis into a memory; analyzing the radio wave environment using a scattering body having a volume reduced by a first predetermined value; and terminating the analysis of the radio environment if a difference between a first radio wave environment at each of the plurality of observation points and a second radio wave environment at each of the plurality of observation points is equal to or lower than a second predetermined value, the first radio wave environment obtained based on an analysis using the scattering body before the volume is reduced, the second radio wave environment obtained based on an analysis using the scattering body after the volume.

The present disclosure provides a radio wave environment analysis device configured to analyze a radio wave environment corresponding to a radio wave of a predetermined strength transmitted from a wireless transmitter arranged within an area, the radio wave environment analysis device including: a processor configured to divide the area into a plurality of block areas including a first block area, the first block area in which the wireless transmitter is arranged, and analyze the radio wave environment using a scattering body located in the first block area; and a memory configured to store an analysis result of the radio wave environment in the first block area based on the analysis, wherein the processor is configured to: virtually arrange a secondary wireless transmitter at a position where the block areas including the first block area are adjacent or overlap, the secondary wireless transmitter being configured to transmit a radio wave of the predetermined strength, and analyze the radio wave environment corresponding to the radio wave transmitted from the secondary wireless transmitter for each of the block areas other than the first block area, and correct the analysis of the radio wave environment corresponding to the radio wave transmitted from the secondary wireless transmitter which is performed for each of the block areas other than the first block area, based on the analysis result of the radio wave environment in the first block area.

The present disclosure provides a radio wave environment analysis method to be performed in a radio wave environment analysis device configured to analyze a radio wave environment corresponding to a radio wave of a predetermined strength transmitted from a wireless transmitter arranged within an area, the radio wave environment analysis method including: dividing the area into a plurality of block areas including a first block area, the first block area in which the wireless transmitter is arranged; analyzing the radio wave environment using a scattering body located in the first block area; storing an analysis result of the radio wave environment in the first block area based on the analysis into a memory; virtually arranging a secondary wireless transmitter at a position where the block areas including the first block area are adjacent or overlap, the secondary wireless transmitter being configured to transmit a radio wave of the predetermined strength, and analyzing the radio wave environment corresponding to the radio wave transmitted from the secondary wireless transmitter for each of the block areas other than the first block area; and correcting the analysis of the radio wave environment corresponding to the radio wave transmitted from the secondary wireless transmitter which is performed for each of the block areas other than the first block area, based on the analysis result of the radio wave environment in the first block area.

The present disclosure provides a radio wave environment analysis device configured to analyze a radio wave environment corresponding to a radio wave of a predetermined strength transmitted from a wireless transmitter arranged within an area, the radio wave environment analysis device including: a processor configured to counts the number of one or more scattering bodies located within a range of a predetermined angle from an arrangement position of the wireless transmitter; and a memory configured to store scattering body data in which a type of the scattering body and a radio wave attenuation amount corresponding to the type are associated with each other, wherein the processor is configured to calculate a radio wave attenuation amount at a position which is located within the range of the predetermined angle and is away from the arrangement position by a designated distance, based on a count result of the scattering bodies located within the range of the predetermined angle and the scattering body data, if the radio wave of the predetermined strength is transmitted from the wireless transmitter in all directions.

The present disclosure provides a radio wave environment analysis method to be performed in a radio wave environment analysis device configured to analyze a radio wave environment corresponding to a radio wave of a predetermined strength transmitted from a wireless transmitter arranged within an area, the radio wave environment analysis method including: counting the number of one or more scattering bodies located within a range of a predetermined angle from an arrangement position of the wireless transmitter; reading scattering body data from a memory, the scattering body data in which a type of the scattering body and a radio wave attenuation amount corresponding to the type are associated with each other; and calculating a radio wave attenuation amount at a position which is located within the range of the predetermined angle and is away from the arrangement position by a designated distance, based on a count result of the scattering bodies located within the range of the predetermined angle and the scattering body data, if the radio wave of the predetermined strength from the wireless transmitter is transmitted in all directions.

According to the present disclosure, the radio wave environment for a wide area can be efficiently analyzed and the radio wave environment can be visualized at a higher speed.

DETAILED DESCRIPTION

Background of Contents of Embodiment 1

Figure 1:
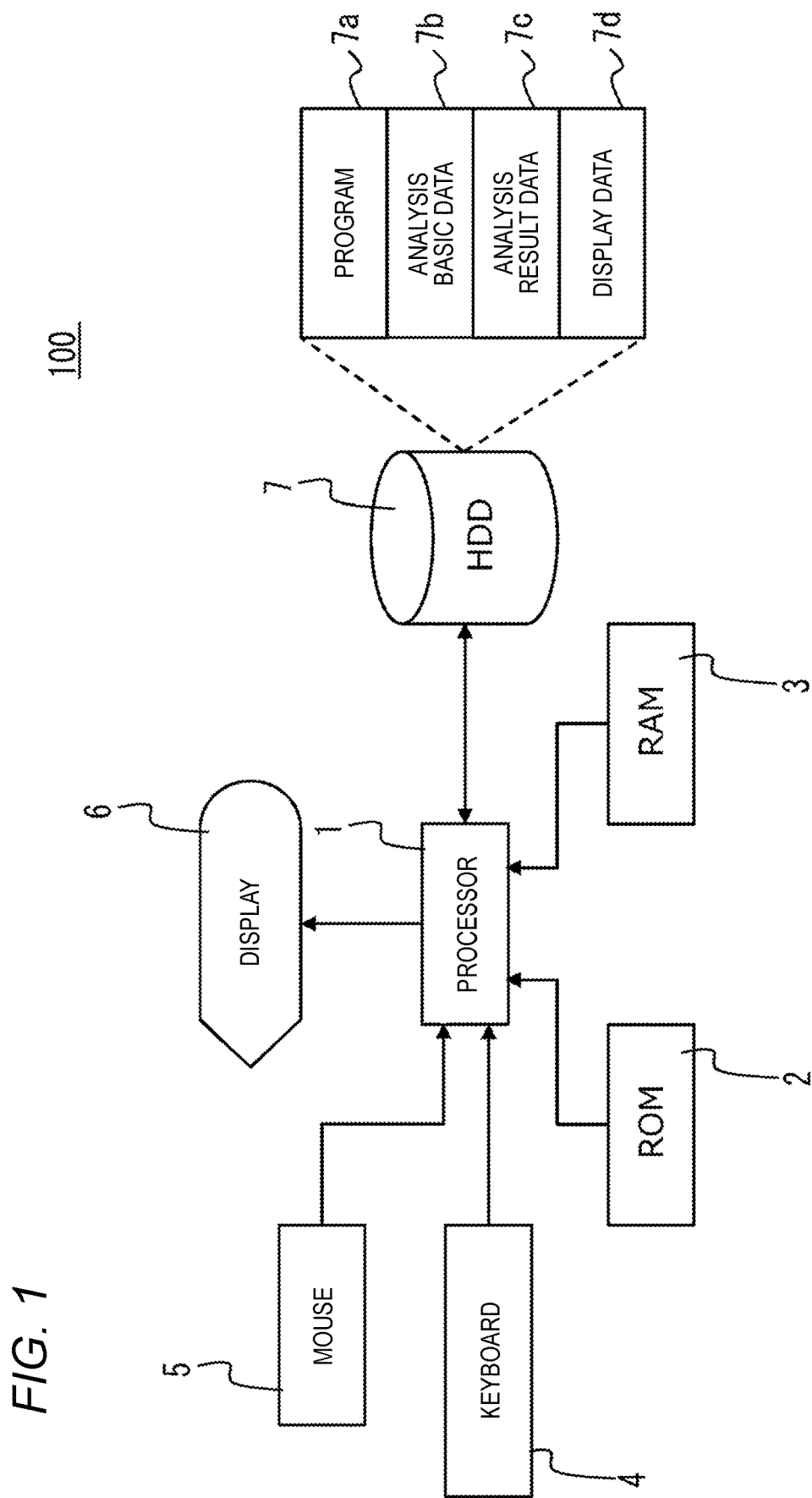
FIG. 1 is a block diagram illustrating an example of a hardware configuration of a radio wave environment display device according to Embodiment 1.

An example of a ray tracing method is described in Tetsuro IMAL "Mobile Radio Propagation Simulation Based on Ray-Tracing Method", IEICE Transactions on Communications, Vol. J92-B, No. 9, pp. 1333-1347, September 2009 (hereinafter referred to as "IMAI"). In the ray tracing method, radio wave propagation characteristics can be simulated by geometrically tracing a ray (that is, a radio wave line as an example of a ray) from a transmission point to a reception point. However, in order to obtain a highly accurate result in the ray tracing method, data (for example, electrical characteristics) of a scattering body (structure) including a shape and a material is required. Since rays that have many interactions such as reflection, diffraction, and transmission are traced for many scattering bodies over a wide range, a large amount of time is required for simulation calculation (in other words, an analysis of a radio wave environment corresponding to transmission of radio waves from the transmission point). In particular, when a wide area (for example, a large facility such as a shopping mall or a wide area outdoors) is targeted, a huge amount of simulation calculation is required and it takes time to analyze the radio wave environment even by using the technique described in IMAI or JP-A-2006-352385, which is one of the disadvantages during radio wave environment visualization generated based on the analysis.

Embodiment 1

Therefore, in the following Embodiment 1, an example of a radio wave environment display device and a radio wave environment display method that assist in efficiently analyzing a radio wave environment for a wide area and visualizing the radio wave environment at a higher speed will be described.

Hereinafter, respective embodiments specifically disclosing the radio wave environment display device and the radio wave environment display method according to the present disclosure will be described in detail with reference to the drawings as appropriate. However, unnecessarily detailed description may be omitted. For example, detailed description of a well-known matter or repeated description of substantially the same configuration may be omitted. This is to avoid unnecessary redundancy in the following description and to facilitate understanding of a person skilled in the art. The attached diagrams and the following description are provided in order for a person skilled in the art to sufficiently understand the present disclosure, and are not intended to limit the matters described in the scope of the claims.

In the following embodiments, a plurality of observation points (in other words, reception points) and at least one wireless transmitter (in other words, transmission point) are provided in a target area (hereinafter abbreviated as "area") for visualization of a radio wave environment, and as the area, a wide area such as outdoors will be described as an example. In the following description, a radio wave environment refers to reception quality at a point in an area calculated in an analysis (simulation) performed by the radio wave environment display device when radio waves are transmitted (radiated) from a wireless transmitter arranged in a transmission point (with reference to below). The reception quality includes, for example, reception power (in other words, reception electric field strength) and an arrival direction.

FIG. 1 is a block diagram illustrating an example of a hardware configuration of a radio wave environment display device 100 according to Embodiment 1. The radio wave environment display device 100 as an example of a radio wave environment analysis device uses analysis basic data 7b related to an area in which a transmission point (for example, the wireless transmitter) is arranged to analyzed a radio wave environment (in other words, simulate a radio wave environment in a case where radio waves transmitted from a transmission point is received at respective points in the area) (with reference to FIGS. 3, 5, 7, and 10). The radio wave environment display device 100 displays analysis result data (for example, a reception power distribution diagram indicating what kind of reception power the radio waves transmitted from the transmission point are received at respective points in the area) of the analysis.

The radio wave environment display device 100 includes a processor 1, a ROM 2, a RAM 3, a keyboard 4, a mouse 5, a display 6, and a Hard Disk Drive (HDD) 7. The ROM 2, the RAM 3, the keyboard 4, the mouse 5, the display 6, and the HDD 7 are connected to the processor 1 via an internal bus or the like in a way that data or information can be input and output.

The processor 1 is configured with, for example, a Central Processing Unit (CPU), a Micro Processing Unit (MPU), a Digital Signal Processor (DSP), or a Field Programmable Gate Array (FPGA). The processor 1 functions as a control unit of the radio wave environment display device 100, controls overall operations of respective units of the radio wave environment display device 100, inputs and outputs data or information into and from respective units of the radio wave environment display device 100, calculates data, and stores data or information. The processor 1 operates according to a program 7a stored in the HDD 7. The processor 1 acquires current time information by using the ROM 2 and the RAM 3 at the time of performing the processing, and outputs analysis result data 7c generated by various kinds of analyses to be described later to the display 6 and displays the analysis result data 7c.

The ROM 2 is a read-only memory, and stores a program and data of an Operating System (OS) in advance. The OS program is executed along with startup of the radio wave environment display device 100.

The RAM 3 is a writable and readable memory, is used as a work memory at the time of executing various kinds of radio wave environment analyses (with reference to FIGS. 3, 5, 7, and 10), and temporarily stores data or information to be used or generated during the various kinds of radio wave environment analyses.

The keyboard 4 and the mouse 5 as examples of an operation input unit has a function as human interfaces with a user, and a user operation is input thereby. In other words, the keyboard 4 and the mouse 5 are used for various settings in various processing executed by the radio wave environment display device 100.

The display 6 as an example of a display device is configured with, for example, a display device such as a Liquid Crystal Display (LCD) or an organic Electroluminescence (EL). The display 6 has a function as a human interface with a user, and displays display data 7d corresponding to contents of various settings or an operating state of the radio wave environment display device 100, various calculation results and an analysis result.

The HDD 7 stores the program 7a for executing various radio wave environment analyses (with reference to FIGS. 3, 5, 7, and 10), the analysis basic data 7b to be used in the various radio wave environment analyses, the analysis result data 7c corresponding to an analysis result based on the various radio wave environment analyses, and the display data 7d generated based on the analysis result data 7c. The analysis basic data 7b includes, for example, data of a map or layout in the area, scattering body data in which a type (for example, a material) of a scattering body (that is, an obstacle that blocks progress of the radio waves) in the area are associated with a material constant (for example, a radio wave attenuation amount) corresponding to the type, and various data or information such as an arrangement position of the wireless transmitter in the area (with reference to below).

The program for analyzing the radio wave environment in the area is read from the HDD 7 to the RAM 3 via the processor 1 and executed by the processor 1. The program may be recorded in a recording medium (not shown, for example, a CD-ROM) other than the HDD 7, and may be read into the RAM 3 by a corresponding reading device (not shown, for example, a CD-ROM drive device).

As described above, the analysis basic data 7b to be used in the radio wave environment analysis in the area includes, for example, the following data or information: (1) data such as transmission power (dBm), a frequency, and a modulation method of a signal transmitted from a wireless transmitter arranged in the area (for example, a wireless transmitter arranged at a transmission point B0 in FIG. 4, and access points P1, AP2, AP3, AP4, AP5 shown in FIG. 11), a gain and a height of an arrangement position of an antenna, etc., (2) data such as a gain and a height of an arrangement position of an antenna in a wireless receiver assumed at the point (that is, a virtual reception point) in the area, (3) data related to two-dimensional or three-dimensional size of the area, (4) data related to a three-dimensional size and position (that is, two-dimensional coordinates within the area) of a scattering body (that is, an obstacle that blocks the progress of the radio waves), and (5) data of a setting value of a lower limit value (for example, "−100 dBm") of reception quality (for example, reception power) calculated based on the analysis.

The radio wave environment display device 100 according to Embodiment 1 can calculate, based on the analysis basic data 7b, the reception power and arrival directions of radio waves at respective points in the area (for example, a plurality of points distributed in an area of 100*100 or the like), by using, for example, a known ray tracing method (with reference to, for example, IMAI) or a known statistical estimation method. Therefore, in Embodiment 1, details of the method of calculating the reception power of the radio waves at the point in the area will be omitted.

(First Example of Analysis)

Figure 2:
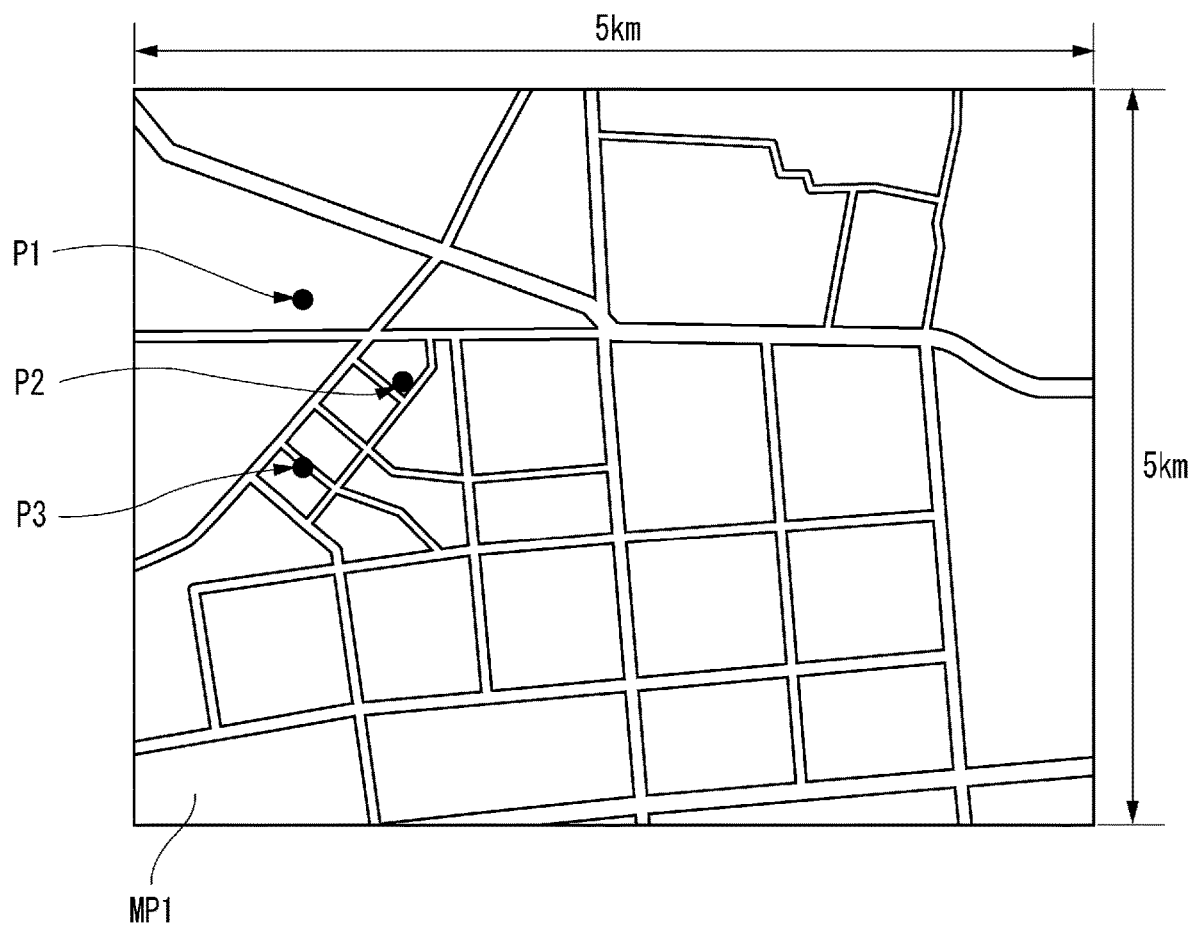
FIG. 2 is a diagram illustrating an example of a model area simulated by the radio wave environment display device according to Embodiment 1.

FIG. 2 is a diagram illustrating an example of a model area simulated by the radio wave environment display device 100 according to Embodiment 1. As shown in FIG. 2, a first example of the model area simulated by the radio wave environment display device 100 according to Embodiment 1 is a wide area, for example, outdoors. As an example of the model area, FIG. 2 shows a map MP1 of an area having an area of 5 km*5 km (*: an operator indicating multiplication)=25 km'. Data of the map MP1 is included in the analysis basic data 7b. Positions P1, P2, P3 indicate observation points (in other words, radio wave reception points or measurement points) that are targets of simulation of the radio wave environment in a case where radio waves (that is, radio signals for simulation) are transmitted from a transmission point (not shown) arranged in the area of the map MP1 shown in FIG. 2.

Figure 3:
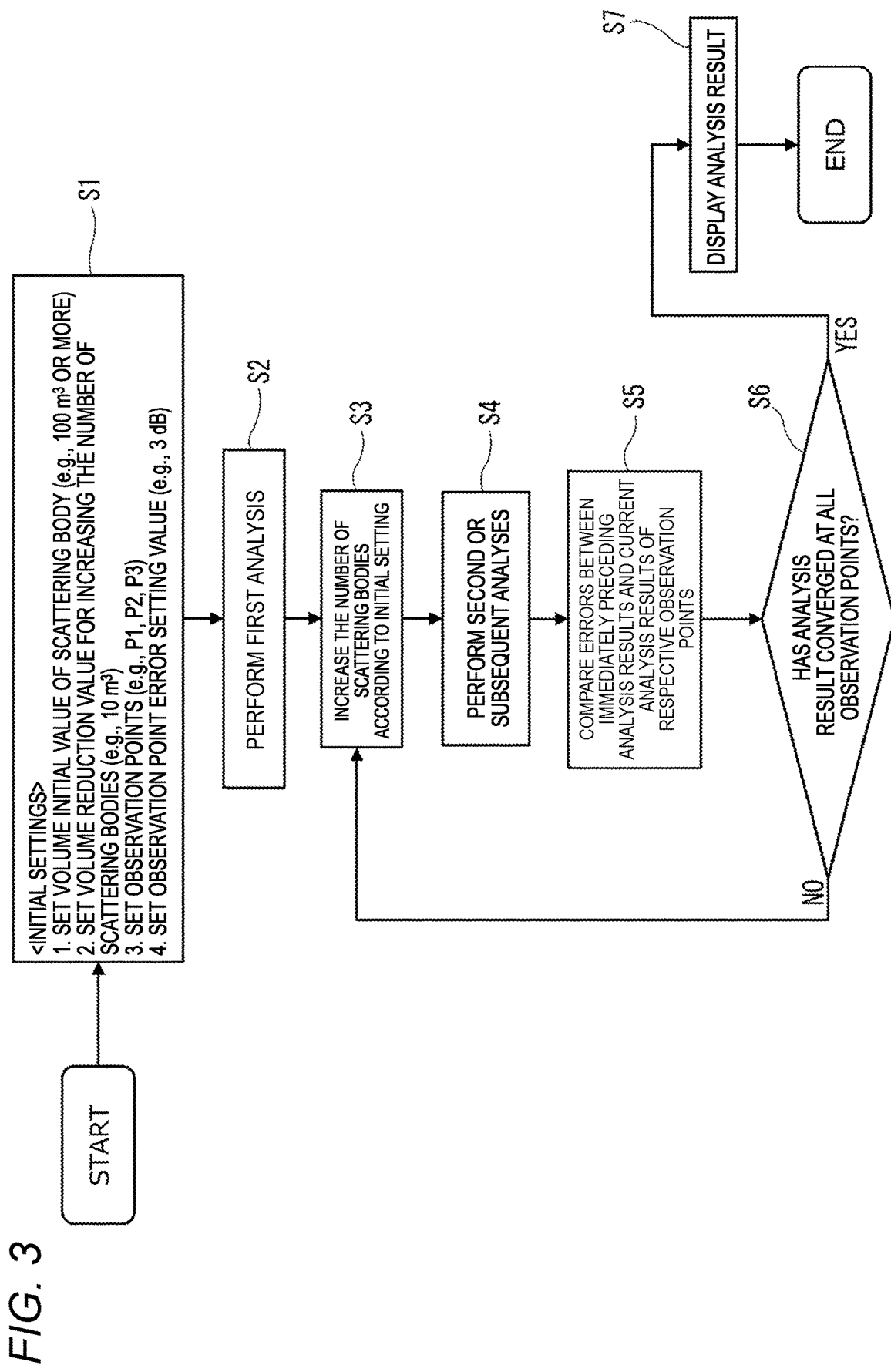
FIG. 3 is a flowchart illustrating a first example of an operation procedure of a radio wave environment analysis at a point in the model area shown in FIG. 2.

FIG. 3 is a flowchart illustrating a first example of an operation procedure of a radio wave environment analysis at the point in the model area shown in FIG. 2. The operation procedure shown in FIG. 3 is executed by, for example, the processor 1 of the radio wave environment display device 100. In the first example of the analysis, since the analysis based on the radio wave environment display device 100 is performed at a higher speed, a volume of a scattering body (for example, a building) that blocks progress of the radio waves transmitted from a transmission point arranged in the map MP1 (area) shown in FIG. 2 is limited to a predetermined value (including a volume initial value to be described later) or more, a scattering body having a volume less than the predetermined value is determined not to exist in the analysis.

In FIG. 3, various parameters are initialized on the radio wave environment display device 100 by a user operation (S1). Specifically, as the various parameters, a volume initial value of the scattering body (for example, 100 m³ or more), a volume reduction value for increasing the number of scattering bodies to be referred to in the analysis (for example, 10 m³), observation points (for example, the positions P1, P2 and P3), and an observation point error setting value (for example, 3 dB) as an example of a convergence condition for terminating the analysis are set.

The radio wave environment display device 100 uses the parameter of the volume initial value of the scattering body set in step S1 and the analysis basic data 7b to perform a first analysis of a radio wave environment at a point in the area in which a scattering body having a volume of a volume initial value (for example, 100 m³ or more) (S2) is assumed to be used. That is, the radio wave environment display device 100 calculates, for each point, reception quality (for example, reception power and arrival direction) of radio waves from the wireless transmitter (not shown) arranged at the transmission point located on the map MP1 based on the analysis basic data 7b, and stores calculation results of the reception power and the arrival direction at each position (location) on the map MP1 in the HDD 7 as the analysis result data 7c.

After step S2, the radio wave environment display device 100 performs a setting of increasing the number of scattering bodies arranged in the map MP1 (area) based on the volume reduction value for increasing the number of scattering bodies that is set in step S1 (S3). Specifically, the radio wave environment display device 100 sets use of a scattering body having a volume of a volume initial value (for example, 100 m³ or more) as a volume of a scattering body to be referred to in the first analysis. The radio wave environment display device 100 sets use of a scattering body having a volume of a value obtained by subtracting (in other words, decreasing) the volume reduction value once from the volume initial value (for example, 90 m³ or more=100 m³ or more−10 m³) as a volume of a scattering body to be referred to in a second analysis. Thus, the radio wave environment display device 100 can perform the analysis by increasing the number of scattering bodies to be referred to in the second analysis from the number of scattering bodies to be referred to in the first analysis.

After step S3, the radio wave environment display device 100 uses the volume value of the scattering body set in step S3 and the analysis basic data 7b to perform the second analysis of the radio wave environment at the point in the area in which the use of the scattering body having a volume of the volume value (=for example, 90 m³ or more) (S4). That is, the radio wave environment display device 100 calculates, for each point, reception quality (for example, reception power and arrival direction) of the radio waves from the wireless transmitter (not shown) arranged at the transmission point located on the map MP1 based on the analysis basic data 7b, and stores calculation results of the reception power and the arrival direction at each position (location) on the map MP1 in the HDD 7 as the analysis result data 7c.

The radio wave environment display device 100 calculates, for each of the observation points on the map MP1 (that is, all the positions P1, P2, P3 set in step S1), an error (that is, a difference) between the analysis result data 7c obtained by the current analysis and the analysis result data 7c obtained by an immediately preceding analysis and compares these errors (S5).

As a result of the comparison in step S5, the radio wave environment display device 100 determines whether or not the analysis result data 7c has converged (that is, a difference calculated in step S5 is equal to or less than the error setting value set in step S1) at the respective observation points (S6) (that is, all positions P1, P2, P3 set in step S1).

If it is determined that the analysis result data 7c has not converged at the respective observation points (that is, all the positions P1, P2, P3 set in step S1) (S6, NO), the processing of the radio wave environment display device 100 returns to step S3. That is, the radio wave environment display device 100 performs a setting of increasing the number of scattering bodies arranged in the map MP1 (area) based on the volume reduction value for increasing the scattering bodies that is set in step S1 (S3). Accordingly, the radio wave environment display device 100 repeats a series of processing of steps S3, S4, S5, and S6 until it is determined that the analysis result data 7c has converged at respective observation points (that is, all positions P1, P2, P3 set in step S1).

If it is determined that the analysis result data 7c has converged at respective observation points (that is, all the positions P1, P2, and P3 set in step S1) (S6, YES), the radio wave environment display device 100 terminates the radio wave environment analysis at the point in the area. Further, the radio wave environment display device 100 displays, on the display 6, an analysis result (not shown) of the radio wave environment analysis at the point in the area (S7).

As described above, the radio wave environment display device 100 according to Embodiment 1 analyzes a radio wave environment corresponding to transmission of a radio wave from a wireless transmitter arranged in an area having a plurality of observation points (for example, positions P1, P2, P3). The radio wave environment display device 100 analyzes, in the processor 1, a radio wave environment using a scattering body having a volume equal to or more than an initial value (for example, a volume initial value), and stores the analysis result data 7c of the radio wave environment at each of the plurality of observation points based on the analysis in the HDD 7 (an example of a memory). The radio wave environment display device 100 analyzes the radio wave environment using a scattering body whose volume is reduced by a volume reduction value (an example of a first predetermined value, for example, 10 m$^3$). The radio wave environment display device 100 terminates the radio wave environment analysis if a difference of the analysis result data 7c of the radio wave environment in each of the plurality of observation points based on the analysis using a scattering body before volume reduction of the volume reduction value and the analysis result data 7c of the radio wave environment in each of the plurality of observation points based on the analysis using a scattering body after volume reduction of the volume reduction value is equal to or less than the error setting value (an example of a second predetermined value, for example, 3 dB).

Accordingly, since the radio wave environment display device 100 can efficiently perform a radio wave environment analysis for a wide area such as outdoors (for example, an area of 25 km$^2$ shown in the map MP1), the radio wave environment display device 100 can assist in visualizing the radio wave environment at a higher speed. That is, as described above, in the radio wave environment analysis, a volume of the scattering body that blocks the progress of the radio waves is limited to the volume initial value and a volume value reduced by the volume reduction value, so that scattering bodies having a volume value less than the initial volume value and the volume value reduced by the volume reduction value are excluded. Therefore, the radio wave environment display device 100 can perform the analysis at a speed higher than an analysis of the radio wave environment at each point for all the scattering bodies actually arranged on the map MP1.

Further, even if the analysis is performed with the volume of the scattering body being reduced by the volume reduction value, the analysis is terminated when only a difference less than the error setting value is obtained at respective observation points (that is, all observation points), so that the radio wave environment display device 100 can acquire the analysis result data 7c with high accuracy while performing the analysis at a higher speed. For example, in obtaining of the analysis results of the radio wave environment over the entire area, there is a need that the observation points (for example, positions P1, P2, P3) are arranged at a plurality of points desired to be observed by a user, and the radio wave environment at points other than those observation points are desired to be roughly grasped through analysis (that is, simulation). In this case, the analysis is performed at a higher speed and the analysis result data 7c with high accuracy can also be acquired, so that the radio wave environment display device 100 can also generate the analysis result data 7c of the radio wave environment that accurately satisfies the need of the user. In other words, the radio wave environment display device 100 can acquire the analysis result data 7c with high accuracy while performing the analysis at a higher speed even if there are interactions such as reflection, transmission, and diffraction of radio waves that exceed a predetermined number of times (for example, 4 to 5 times), which is pointed out as a limit when the ray tracing method is used in a wide area such as outdoors.

(Second Example of Analysis)

Figure 4:
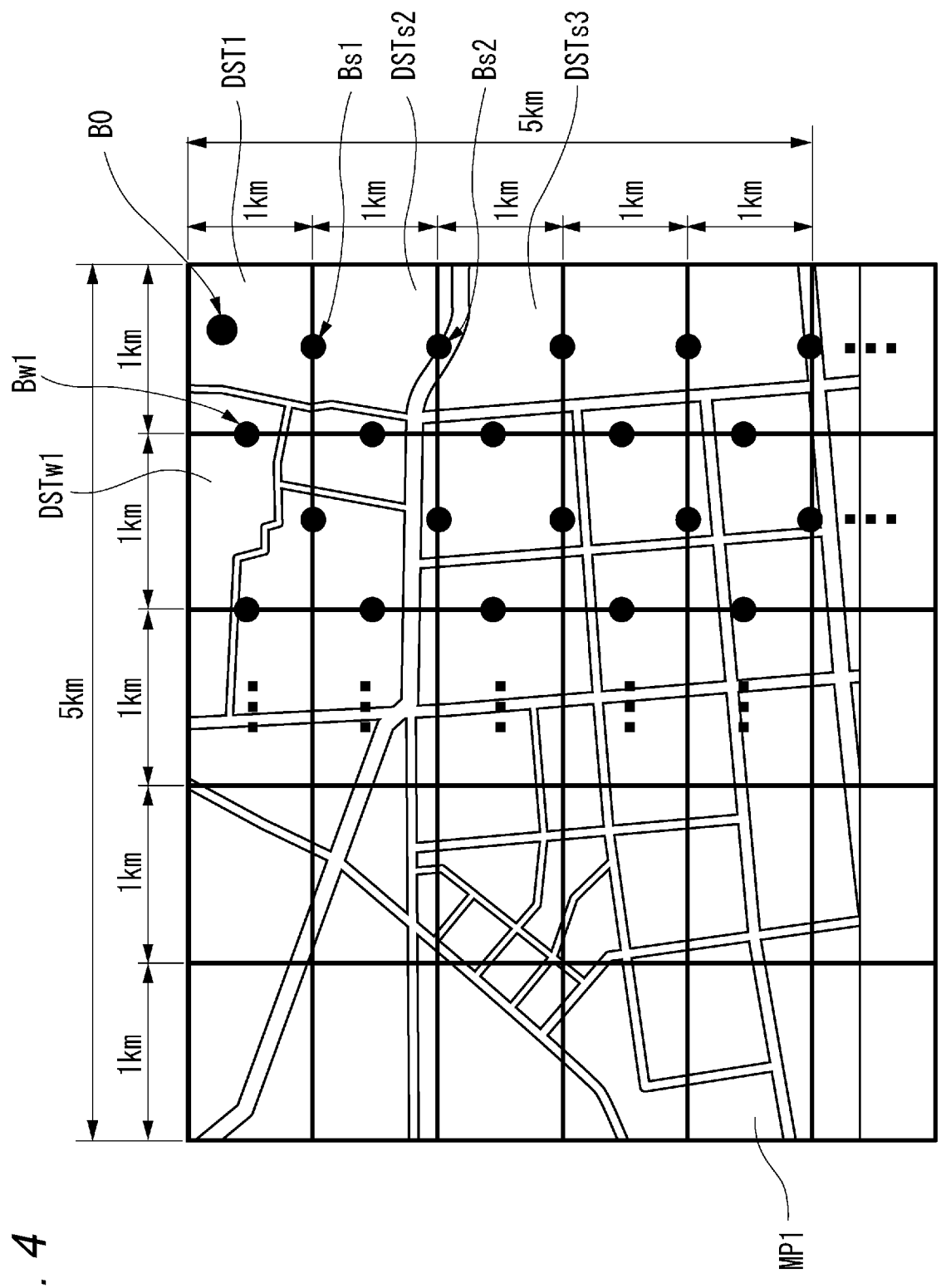
FIG. 4 is a diagram illustrating an example of a model area simulated by the radio wave environment display device according to Embodiment 1.

FIG. 4 is a diagram illustrating an example of a model area simulated by the radio wave environment display device 100 according to Embodiment 1. The same elements as those in the first example of the analysis are denoted by the same reference numerals, the description thereof will be simplified or omitted, and different contents will be described. As shown in FIG. 4, a second example of the model area simulated by the radio wave environment display device 100 according to Embodiment 1 (that is, a second example of the radio wave environment analysis at the point in an area) is a wide area, for example, outdoors or the like. FIG. 4 shows, as an example of the model area, a plurality of block areas obtained by dividing the map MP1 (with reference to FIG. 2) of an area having an area of 5 km*5 km (*: an operator indicating multiplication)=25 km$^2$ or more. An area of each block area (specifically, a first block area DST1, block areas DSTw1, DSTs2, DSTs3 . . . ) is 1 km*1 km=1 km$^2$, for example.

Unlike the first example of the radio wave environment analysis, in the second example of the radio wave environment analysis, the radio wave environment display device 100 divides an entire area of the map MP1 shown in FIG. 4 into a plurality of block areas and sets each block area as an analysis target without targeting the entire area of the map MP1. For example, in the second example of the radio wave environment analysis, it is assumed that the transmission point B0 is arranged in the first block area DST1 generated on the map MP1, a radio wave of predetermined strength (for example, 0 dBm) is transmitted, and a radio wave environment is analyzed for the first block area DST1. Further, it is assumed that a virtual secondary transmission point (that is, a secondary wireless transmitter) that transmits radio waves having the same strength as the above-mentioned predetermined strength is arranged in any of adjacent boundary positions of each block area (for example, a midpoint position of one side in a longitudinal direction of a block area (for example, positions Bs1, Bs2) and a midpoint position of one side orthogonal to the one side in the longitudinal direction (for example, a position Bw1)), and the radio wave environment analysis is performed for the remaining block areas other than the first block area DST1. Lastly, in consideration of a lower limit of the reception quality of the radio wave environment and the analysis result data 7c in the first block area DST1, strength of the radio wave transmitted by the secondary wireless transmitter arranged at each of the secondary transmission points is corrected, and thus the radio wave environment at the point within the entire area is analyzed (with reference to FIG. 5).

Figure 5:
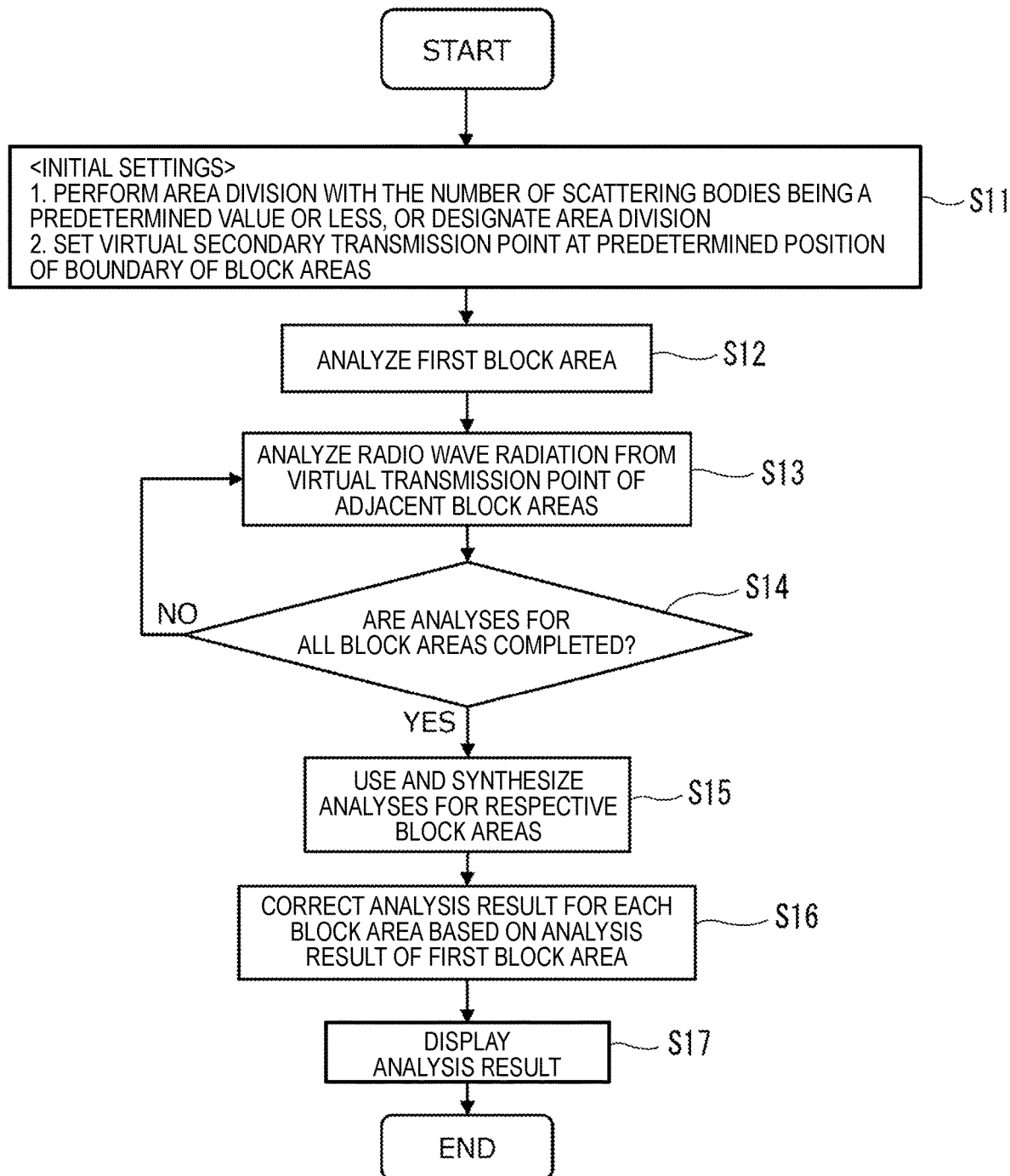
FIG. 5 is a flowchart illustrating a second example of the operation procedure of the radio wave environment analysis at the point in the model area shown in FIG. 2.

FIG. 5 is a flowchart illustrating a second example of an operation procedure of a radio wave environment analysis at a point in the model area shown in FIG. 2. The operation procedure shown in FIG. 5 is executed by, for example, the processor 1 of the radio wave environment display device 100. In the second example of the analysis, in order to speed up the analysis of the radio wave environment display device 100, the map MP1 (area) shown in FIG. 4 is divided into a plurality of block areas, each block area is analyzed, and when an analysis result of each block area is used to generate an analysis result in the entire area, the analysis result of each block area is corrected.

In FIG. 5, various parameters are initialized on the radio wave environment display device 100 by a user operation (S11). Specifically, as the various parameters, the radio wave environment display device 100 divides an area to be analyzed (for example, an area of the map MP1) into a plurality of block areas so as to reduce the number of scattering bodies arranged at each point of the map MP1 (area) to be equal to or less than a predetermined value. Alternatively, the radio wave environment display device 100 divides the same area (refer to the above) into a plurality of blocks by a user operation. Further, a virtual secondary transmission point (for example, a position Bs1) is set at a predetermined position (for example, a midpoint position) of a boundary between a block area (for example, the first block area DST1) and another block area (for example, the block area DSTs2) which are adjacent each other.

The radio wave environment display device 100 uses the analysis basic data 7b to analyze, for the first block area DST1 (with reference to FIG. 4) among the plurality of block areas set in step S11, the radio wave environment at each point in which the scattering body arranged in the first block area DST1 is assumed to be used (S12). That is, the radio wave environment display device 100 calculates, for each point in the first block area DST1, reception quality (for example, reception power and arrival direction) of radio waves from the wireless transmitter (not shown) arranged at the transmission point B0 located on the map MP1 based on the analysis basic data 7b, and stores calculation results of the reception power and the arrival direction at each point into the HDD 7 as the analysis result data 7c.

The radio wave environment display device 100 uses the analysis basic data 7b to analyze, for a block area (for example, block areas DSTs2, DSTw1) adjacent to the first block area DST1, the radio wave environment at each point, in which a case is assumed where radio waves of predetermined strength are transmitted from the virtual secondary transmission point (for example, the position Bs1) set in step S11 (S13). The predetermined strength is, for example, the same strength as the strength (0 dBm) of the radio wave transmitted from the transmission point B0. Further, the radio wave environment display device 100 determines whether or not the similar radio wave environment analysis is performed for the block areas provided in the entire area of the map MP1 (S14). The radio wave environment display device 100 repeats the processing of step S13 until the similar radio wave environment analysis is performed for the block areas provided in the entire area of the map MP1 (S13, NO).

On the other hand, if it is determined that the similar radio wave environment analysis is performed for the block areas provided in the entire area of the map MP (S14, YES), the radio wave environment display device 100 synthesizes the analysis result data 7c of the analyses for the respective block areas to generate the analysis result data 7c for the entire area in the map MP1 (S15).

After step S15, the radio wave environment display device 100 corrects the analysis result data 7c of the analyses for the respective block areas based on the analysis result data 7c (an analysis result) corresponding to the first block area DST1 (S16).

Here, correction of the analysis result data 7c in each of the block areas DSTs2 adjacent to the first block area DST1 and the block area DSTs3 adjacent to the block area DSTs2 will be briefly described.

First, it is assumed that the strength of the radio wave transmitted from the transmission point B0 is "0 dBm", and reception power (strength) of the radio wave at the boundary position (for example, the position Bs1) in the analysis result data 7c corresponding to the first block area DST1 in step S13 is "−40 dBm". As described above, the strength of the radio wave transmitted from the secondary wireless transmitter (not shown) assumed to be arranged at the position Bs1 of the secondary transmission point in the block area DSTs2 is uniformly set to "0 dBm". Accordingly, in step S16, the analysis result data 7c corresponding to the block area DSTs2 is corrected so as to be uniformly added by about "−40 dBm" from the analysis result data 7c at respective points in the block area DSTs2 calculated in step S13.

Next, it is assumed that the reception power (strength) of the radio wave at the boundary position (for example, the position Bs2) in the analysis result data 7c corresponding to the block area DSTs2 in step S13 is "−25 dBm". As described above, the strength of the radio wave transmitted from the secondary wireless transmitter (not shown) assumed to be arranged at the position Bs2 of the secondary transmission point in the block area DSTs3 is uniformly set to "0 dBm". Accordingly, in step S16, the analysis result data 7c corresponding to the block area DSTs3 is corrected so as to be uniformly added by about "−65 dBm" (="−40 dBm" which is the correction amount of the first block area DST1+"−25 dBm" which is the correction amount of the block area DSTs2) from the analysis result data 7c at respective points in the block area DSTs2 calculated in step S13.

In step S16, the radio wave environment display device 100 corrects the analysis result data 7c so as not to fall below the lower limit value (for example, −100 dBm) of the reception quality (for example, reception power) included in the analysis result data 7c based on the radio wave environment analysis. For this reason, when the reception quality after correction (for example, reception power) is equal to or less than the lower limit in the correction of step S16, the radio wave environment display device 100 calculates the analysis result data 7c employing the lower limit value as the reception quality (for example, reception power) at that point.

After step S16, the radio wave environment display device 100 terminates the radio wave environment analysis at the point in the area of the map MP1. Further, the radio wave environment display device 100 displays, on the display 6, an analysis result (not shown) of the radio wave environment analysis at the point in the area of the map MP1 (S17).

As described above, the radio wave environment display device 100 according to Embodiment 1 analyzes a radio wave environment corresponding to transmission of radio waves of predetermined strength (for example, 0 dBm) from a wireless transmitter (not shown) arranged in an area (for example, the transmission point B0) of the map MP1. The radio wave environment display device 100 divides the area into a plurality of block areas, analyzes, in the processor 1, a radio wave environment by using a scattering body located in the first block area DST1 in which the wireless transmitter is arranged, and stores, into the HDD 7 (an example of a memory), the analysis result of the radio wave environment at each point of the first block area DST1 based on the analysis. The radio wave environment display device 100 virtually arranges a secondary wireless transmitter that transmits radio waves of predetermined strength (for example, 0 dBm) at a boundary position where block areas including the first block area DST1 are adjacent, and analyzes the radio wave environment corresponding to the radio wave transmission from the secondary radio transmitter for each block area other than the first block area DST1 (for example, block areas DSTw1, DSTs2, DSTs3, . . . ). Based on the analysis result of the radio wave environment in the first block area DST1, the radio wave environment display device 100 corrects the analysis of the radio wave environment corresponding to the transmission of radio waves from the secondary wireless transmitter which is performed for each block area other than the first block area DST1.

Therefore, a wide area such as outdoors (for example, an area of 25 km$^2$ or more shown in the map MP1) can be divided into a plurality of block areas and the radio wave environment can be efficiently analyzed for each block area, so that the radio wave environment display device 100 can visualize the radio wave environment at a higher speed. In addition, since the reliability of the analysis result based on the analysis (simulation) for each block area can be improved by finely dividing and analyzing the block area to be analyzed, the radio wave environment display device 100 can accurately guarantee the generation accuracy of the analysis result data for the entire area after the correction. Therefore, the radio wave environment display device 100 can perform the analysis at a speed higher than an analysis of the radio wave environment at each point for all the scattering bodies actually arranged on the map MP1.

For example, in obtaining of the analysis results of the radio wave environment over the entire area, there is a need that the observation points are arranged at a plurality of points desired to be observed by a user, and the radio wave environment at points other than those observation points are desired to be roughly grasped through analysis (that is, simulation). In this case, since each of the plurality of block areas is analyzed at a higher speed and the synthesized analysis result for each block area is also corrected, the analysis result data 7c with high accuracy can also be acquired, so that the radio wave environment display device 100 can also generate the analysis result data 7c of the radio wave environment that accurately satisfies the need of the user. In other words, the radio wave environment display device 100 can acquire the analysis result data 7c with high accuracy while performing the analysis at a higher speed even if there are interactions such as reflection, transmission, and diffraction of radio waves that exceed a predetermined number of times (for example, 4 to 5 times), which is pointed out as a limit when the ray tracing method is used in a wide area such as outdoors.

The radio wave environment display device 100 may individually perform the same analysis (with reference to FIG. 3) as the analysis described in the first example of the analysis in the analysis for each block area in steps S12 and S13. Accordingly, the radio wave environment display device 100 can perform analysis in consideration of the magnitude of the volume of the scattering body arranged for each block area, and therefore, the analysis can be performed at a higher speed.

(Modification of Second Example of Analysis)

Figure 6:
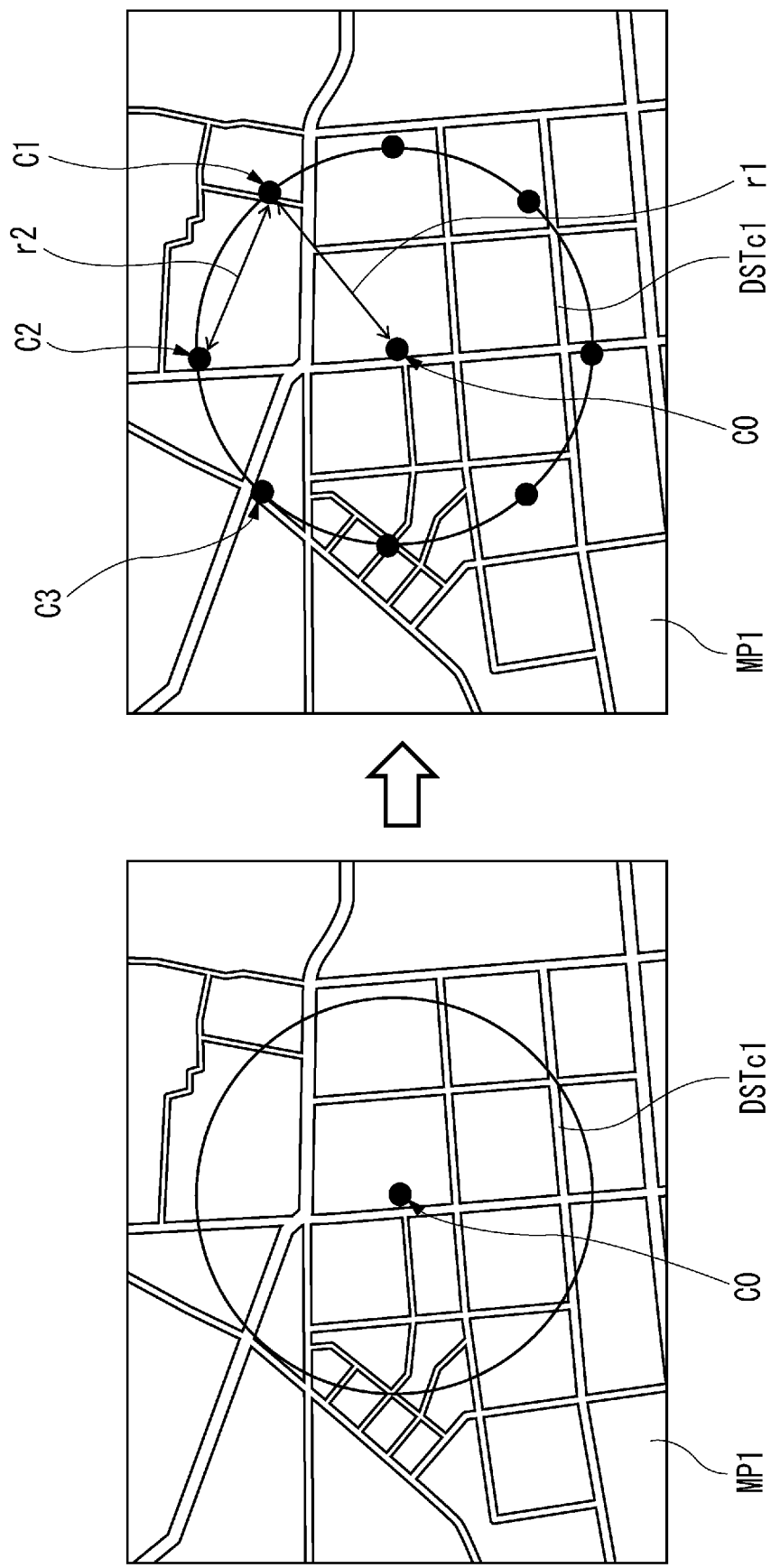
FIG. 6 is a diagram illustrating an example of a model area simulated by the radio wave environment display device according to Embodiment 1.

FIG. 6 is a diagram illustrating an example of a model area simulated by the radio wave environment display device 100 according to Embodiment 1. The same elements as those in the first example or second example of the analysis are denoted by the same reference numerals, the description thereof will be simplified or omitted, and different contents will be described. As shown in FIG. 6, a modification of the second example of the model area simulated by the radio wave environment display device 100 according to Embodiment 1 (that is, the second example of the radio wave environment analysis at the point in an area) is similarly a wide area, for example, outdoors or the like. As an example of the model area, FIG. 6 shows the map MP1 (with reference to FIG. 2) of an area having an area of 5 km*5 km (*: an operator indicating multiplication)=25 km$^2$.

Unlike the second example of the radio wave environment analysis, in the modification of the second example of the radio wave environment analysis, the radio wave environment display device 100 arranges the wireless transmitter at a predetermined position (for example, a position of the transmission point C0) of the map MP1, and sets a circular area having a radius r1 (a predetermined value) or less from the transmission point C0 as a first block area DSTc1 without targeting the entire area of the map MP1 shown in FIG. 6. For example, in the modification of the second example of the radio wave environment analysis, it is assumed that the transmission point C0 is arranged in the first block area DSTc1, and radio waves of predetermined strength (for example, 0 dBm) are transmitted, and radio wave environment is analyzed for the first block area DSTc1. Further, it is assumed that a virtual secondary transmission point (that is, a secondary wireless transmitter) that transmits radio waves having the same strength as the predetermined strength is arranged at positions of positions C1, C2, C3, . . . centering on a position of the transmission point C0 of the first block area DSTc1 and existing on an arc at equal intervals for each distance r2, and radio wave environment is individually analyzed for a circular block area centering on a position of each secondary transmission point and having a radius r1. Lastly, in consideration of the lower limit of the reception quality of the radio wave environment and the analysis result data 7c in the first block area DSTc1, the strength of the radio waves transmitted by the secondary wireless transmitter arranged at each of the secondary transmission points is corrected, and thus the radio wave environment at the point within the entire area is analyzed (with reference to FIG. 7).

Figure 7:
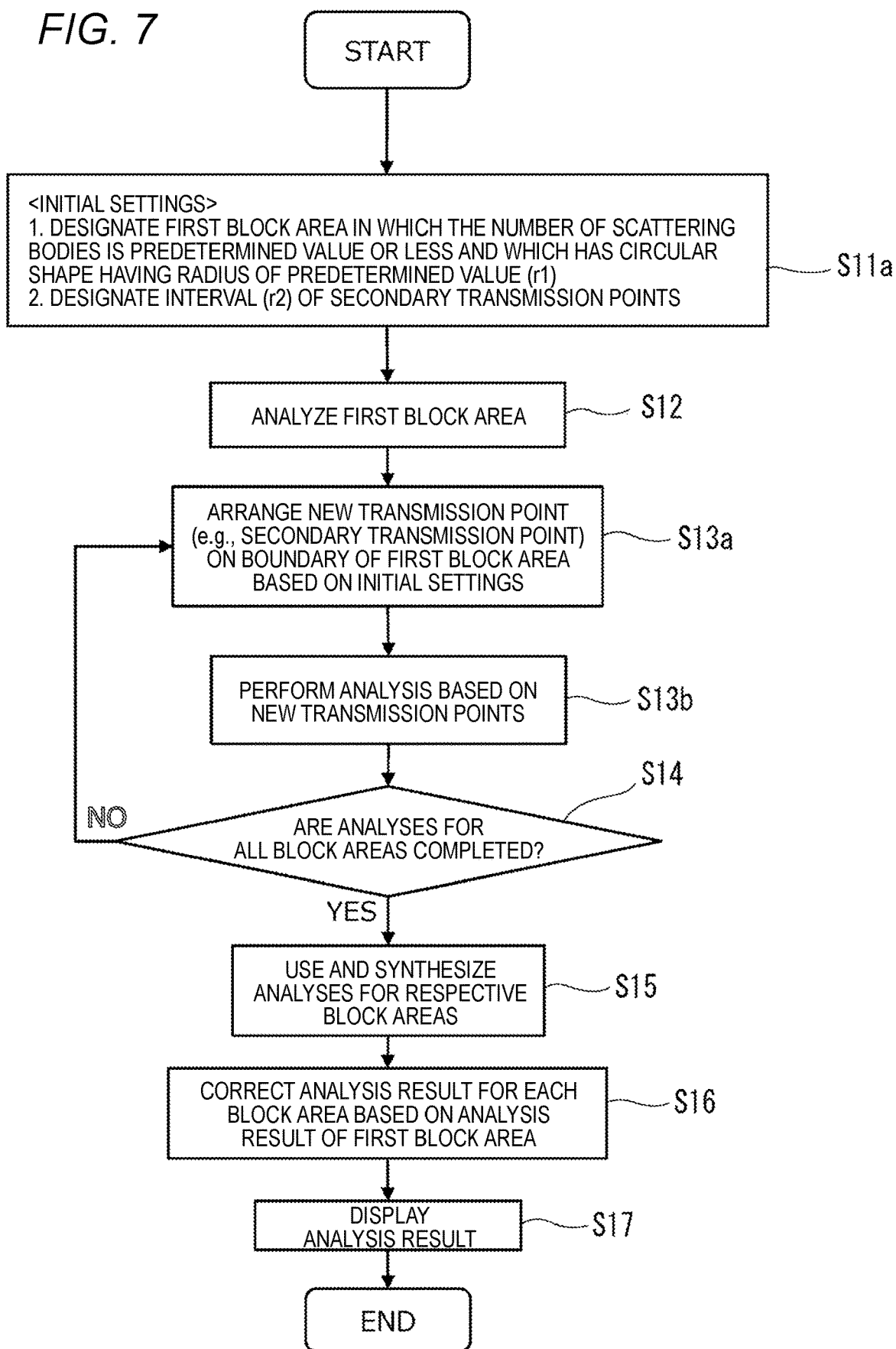
FIG. 7 is a flowchart illustrating a modification of the second example of the operation procedure of the radio wave environment analysis at the point in the model area shown in FIG. 2.

FIG. 7 is a flowchart illustrating a modification of the second example of the operation procedure of the radio wave environment analysis at the point in the model area shown in FIG. 2. The operation procedure shown in FIG. 7 is performed by, for example, the processor 1 of the radio wave environment display device 100. In the description of the operation procedure shown in FIG. 7, the same steps as those in the operation procedure shown in FIG. 5 are donated the same step numbers, the description thereof will be simplified or omitted, and different contents will be described. In the modification of the second example of the analysis, in order to speed up the analysis of the radio wave environment display device 100, the analysis is performed for a plurality of circular block areas each having a circular first block area DSTc1 centering on the transmission point C0 located at a position in the map MP1 (area) shown in FIG. 6 and having a plurality of positions on the arc of the first block area DSTc1 as secondary transmission points, and when the analysis result of each block area is used to generate an analysis result in the entire area, the analysis result of each block area is corrected.

In FIG. 7, various parameters are initialized on the radio wave environment display device 100 by a user operation (S11a). Specifically, as the various parameters, the radio wave environment display device 100 sets the circular first block area DSTc1 having a radius r1 including the transmission point C0 in which the wireless transmitter (not shown) is assumed to be arranged in the map MP1 (area), so as to reduce the number of scattering bodies arranged at each point of the map MP1 (area) to be equal to or less than a predetermined value. Further, an interval (distance r2) of the secondary transmission points arranged on the arc of the first block area DSTc1 is set.

The radio wave environment display device 100 targets the first block area DSTc1 (with reference to FIG. 6) set in step S11a, and use the analysis basic data 7b to analyze the radio wave environment at each point in which the scattering body arranged in the first block area DSTc1 is assumed to be used (S12). That is, the radio wave environment display device 100 calculates, for each point in the first block area DSTc1, reception quality (for example, reception power and arrival direction) of radio waves from the wireless transmitter (not shown) arranged at the transmission point C0 located on the map MP1 based on the analysis basic data 7b, and stores calculation results of the reception power and the arrival direction at each point into the HDD 7 as the analysis result data 7c.

The radio wave environment display device 100 performs a setting of arranging new transmission points (secondary transmission points) at a plurality of positions (for example, positions C1, C2, C3, . . . ) on the arc of the circular first block area DSTc1 by using a set value of the distance r2 set in step S11a (S13a). The radio wave environment display device 100 targets a circular area (an example of a block area) centering on each of the plurality of secondary transmission points set in step S13a and having a radius r1, and uses the analysis basic data 7b to analyze the radio wave environment at a point in each area in which a case where radio waves of predetermined strength is transmitted from the secondary transmission points (for example, positions C1, C2, C3, . . . ) is assumed (S13b). The predetermined strength is, for example, the same strength as the strength (0 dBm) of the radio wave transmitted from the transmission point C0. Further, the radio wave environment display device 100 determines whether or not the similar radio wave environment analysis is performed for the block areas provided in the entire area of the map MP1 (specifically, all the block areas including the first block area DSTc1) (S14). The radio wave environment display device 100 repeats the processing of steps S13a and 513b until the similar radio wave environment analysis is performed for the block areas (with reference to the above) provided in the entire area of the map MP1 (S14, NO).

On the other hand, if it is determined that the similar radio wave environment analysis is performed for the block areas (with reference to the above) provided in the entire area of the map MP1 (S14, YES), the radio wave environment display device 100 synthesizes the analysis result data 7c of the analyses for the respective block areas to generate the analysis result data 7c for the entire area in the map MP1 (S15).

After step S15, the radio wave environment display device 100 corrects the analysis result data 7c of the analyses for the respective block areas based on the analysis result data 7c (an analysis result) corresponding to the first block area DSTc1 (S16). Here, correction of the analysis result data 7c in a block area overlapping the first block area DSTc1 and each of other block areas adjacent to the block area is similar to the correction of the second example of the analysis, and therefore detailed description thereof will be omitted. However, unlike the second example of the analysis, there is an overlap range between block areas in the modification of the second example of the analysis, so that the analysis result data 7c in the overlap range is corrected after the analysis result data 7c in an upper-level block area (in other words, a block area closer to the transmission point C0) is preferentially adopted.

Since the processing of the radio wave environment display device 100 after step S16 is the same as the processing shown in FIG. 5, the subsequent description will be omitted.

As described above, the radio wave environment display device 100 according to Embodiment 1 analyzes a radio wave environment corresponding to transmission of radio waves of predetermined strength (for example, 0 dBm) from a wireless transmitter (not shown) arranged in an area (for example, transmission point C0) of the map MP1. The radio wave environment display device 100 divides an area into a plurality of block areas, analyzes, in the processor 1, a radio wave environment by using a scattering body located in the first block area DSTc1 in which the wireless transmitter is arranged, and stores, into the HDD 7 (an example of a memory), the analysis result of the radio wave environment at each point of the first block area DST1 based on the analysis. The radio wave environment display device 100 virtually arranges a secondary radio transmitter that transmits radio waves of predetermined strength (for example, 0 dBm) at a position (for example, positions C1, C2, C3, . . . on the arc of the first block area DSTc1) where block areas including the first block area DSTc1 overlap, and analyzes the radio wave environment corresponding to transmission of the radio waves from each secondary wireless transmitter for each block area other than the first block area DSTc1. Based on the analysis result of the radio wave environment in the first block area DSTc1, the radio wave environment display device 100 corrects the analysis of the radio wave environment corresponding to transmission of the radio waves from each secondary wireless transmitter which is performed for each block area other than the first block area DSTc1.

Therefore, a wide area such as outdoors (for example, an area of 25 km$^2$ shown in the map MP1) can be divided into a plurality of block areas and the radio wave environment can be efficiently analyzed for each block area, so that the radio wave environment display device 100 can visualize the radio wave environment at a higher speed. In addition, since the reliability of the analysis result based on the analysis (simulation) for each block area can be improved by finely dividing and analyzing the block area to be analyzed, the radio wave environment display device 100 can accurately guarantee the generation accuracy of the analysis result data for the entire area after the correction. Therefore, the radio wave environment display device 100 can perform the analysis at a speed higher than an analysis of the radio wave environment at each point for all the scattering bodies actually arranged on the map MP1.

For example, in obtaining of the analysis results of the radio wave environment over the entire area, there is a need that the observation points are arranged at a plurality of points desired to be observed by a user, and the radio wave environment at points other than those observation points are desired to be roughly grasped through analysis (that is, simulation). In this case, since each of the plurality of block areas including the first block area DSTc1 is analyzed at a higher speed and the synthesized analysis result for each block area is also corrected, the analysis result data 7c with high accuracy can also be acquired, so that the radio wave environment display device 100 can also generate the analysis result data 7c of the radio wave environment that accurately satisfies the need of the user. In other words, the radio wave environment display device 100 can acquire the analysis result data 7c with high accuracy while performing the analysis at a higher speed even if there are interactions such as reflection, transmission, and diffraction of radio waves that exceed a predetermined number of times (for example, 4 to 5 times), which is pointed out as a limit when the ray tracing method is used in a wide area such as outdoors.

The radio wave environment display device 100 may individually perform the same analysis (with reference to FIG. 3) as the analysis described in the first example of the analysis in the analysis for each block area in steps S12 and S13b. Accordingly, the radio wave environment display device 100 can perform analysis in consideration of the magnitude of the volume of the scattering body arranged for each block area, and therefore, the analysis can be performed at a higher speed.

The radio wave environment display device 100 may omit the calculation based on a value of the electric field strength in the analyses of Step S2 and Step S3 of the first example of the analysis and the analyses of Step S12 and Step S13 of the second example of the analysis and in other analyses. Specifically, when a calculated electric field strength exceeds the lower limit value (for example, −100 dBm) (that is, equal to or lower than the lower limit value) specified during the analysis, the radio wave environment display device 100 may omit the analysis of the area. For example, it is sufficient to perform an analysis in a range of about 100 m during analysis of an area of 5 km square if the radio wave is 2 GHz, and the lower limit value is determined in advance before the analysis, so that the radio wave environment display device 100 omits the analysis of the area when the calculated electric field strength is equal to or lower than the lower limit value. Therefore, the radio wave environment display device 100 does not calculate an unnecessary route, and the analysis can be performed at a higher speed.

(Third Example of Analysis)

Figure 8:
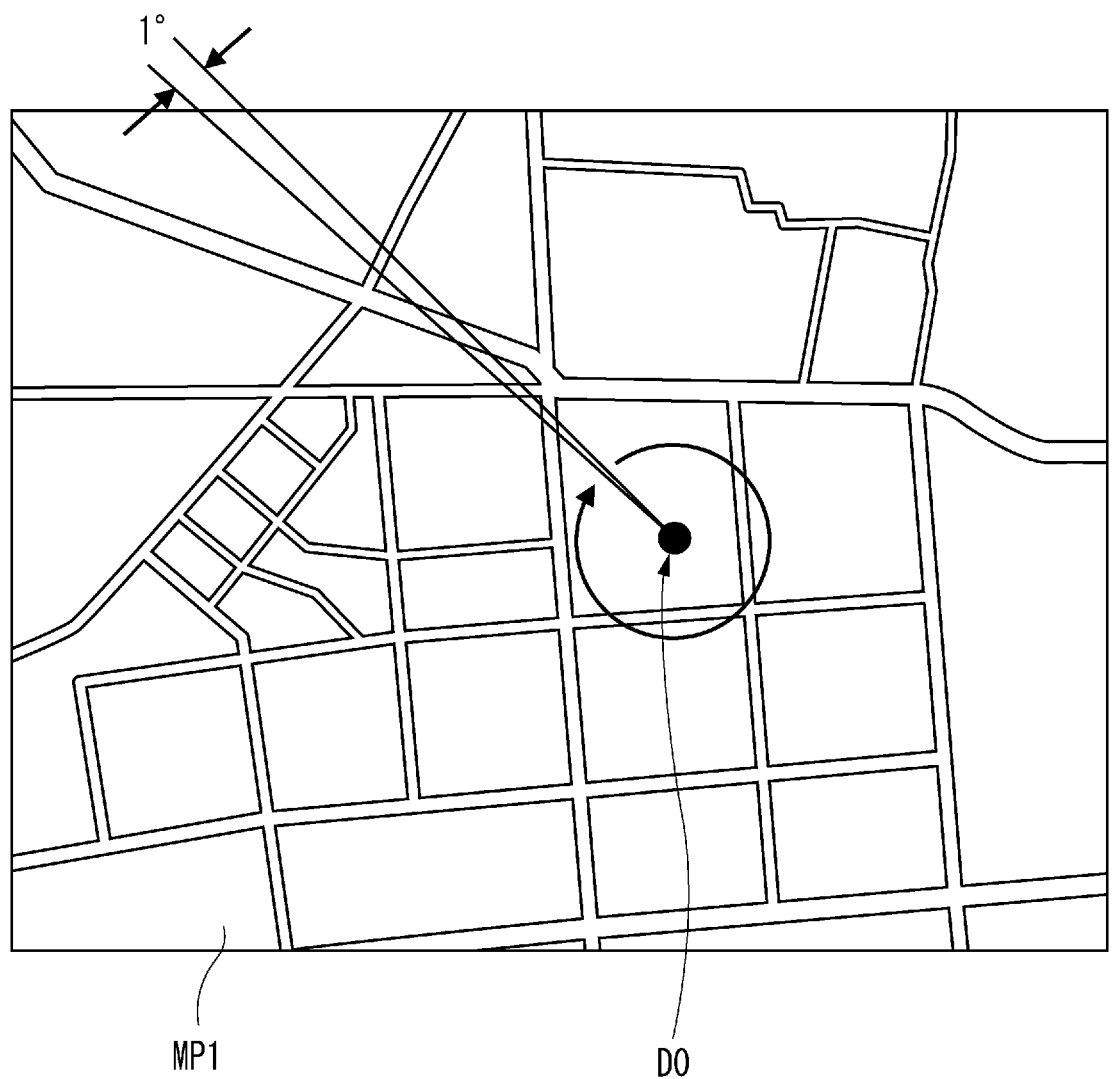
FIG. 8 is a diagram illustrating an example of a model area simulated by the radio wave environment display device according to Embodiment 1.

FIG. 8 is a diagram illustrating an example of a model area simulated by the radio wave environment display device 100 according to Embodiment 1. As shown in FIG. 8, a third example of the model area simulated by the radio wave environment display device 100 according to Embodiment 1 (that is, a third example of the radio wave environment analysis at the point in an area) is similarly a wide area, for example, outdoors or the like. As an example of the model area, FIG. 8 shows the map MP1 (with reference to FIG. 2) of an area having an area of 5 km*5 km (*: an operator indicating multiplication)=25 km².

In the third example of the radio wave environment analysis, the radio wave environment display device 100 sets a location of the wireless transmitter at a position of the area of the map MP1 (that is, a transmission point D0). The radio wave environment display device 100 calculates a radio wave attenuation amount within a range of a predetermined angle (for example, 1°) from the transmission point D0, at a position (that is, an observation point) away from the transmission point D0 by a distance designated by a user operation in a case where uniform rays (that is, radio waves of predetermined strength) in all directions of 360 degrees are transmitted from the transmission point D0. The predetermined strength is, for example, "0 dBm".

Figure 9:
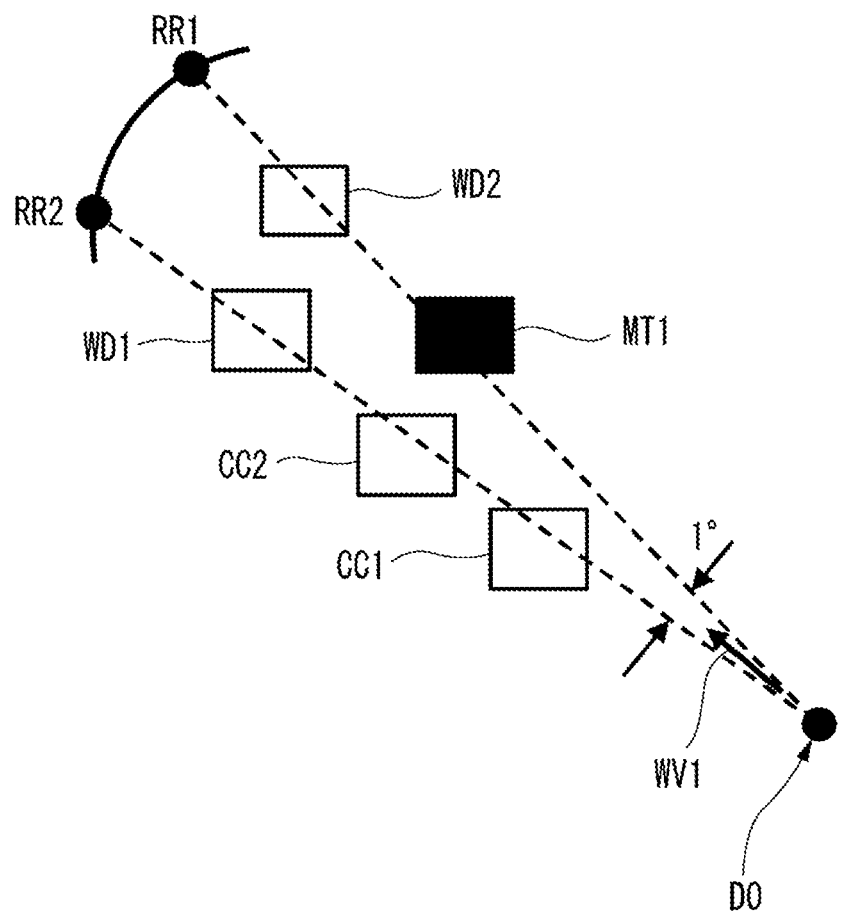
FIG. 9 is a diagram schematically illustrating an example of calculation of a radio wave attenuation amount of radio waves at a point located within a range of 1° in which radio waves are transmitted from a transmission point D0.

FIG. 9 is a diagram schematically illustrating an example of calculation of a radio wave attenuation amount of radio waves WV1 at points (for example, positions RR1, RR2) located within a range of 1° in which radio waves are transmitted from the transmission point D0. As shown in FIG. 9, the transmission point D0 corresponds to the transmission point D0 shown in FIG. 8. When the radio waves WV1 of predetermined strength (for example, 0 dBm) are transmitted from the wireless transmitter arranged at the transmission point D0 within a range of 1° centering on the transmission point D0 (for example, within a fan-shaped range defined by the transmission point D0 and the positions RR1, RR2 on an arc in the case of centering on the transmission point D0), respective radio wave attenuation amounts at the positions RR1, RR2 are calculated by the radio wave environment display device 100.

Here, a metal body MT1 and a wood WD2 are arranged on a virtual straight line from the transmission point D0 toward the position RR1. Since the metal body reflects the radio waves without transmitting the radio waves, the radio waves WV1 do not reach the position RR1 from the transmission point D0, and calculation of the radio wave attenuation amount at the position RR1 is omitted in the radio wave environment display device 100.

Meanwhile, on a virtual straight line from the transmission point D0 to the position RR2, the metal body is not arranged, and two concrete structures CC1, CC2 and a wood WD1 are arranged. Therefore, when the radio waves WV1 reach the position RR2 from the transmission point D0, the radio wave environment display device 100 calculates the radio wave attenuation amount at the position RR2 as follows.

Specifically, the radio wave environment display device 100 calculates the radio wave attenuation amount within the range of 1° shown in FIG. 9 from the transmission point D0 (within the fan-shaped range defined by the transmission point D0 and the positions RR1, RR2 on an arc in the case of centering on the transmission point D0) as a total value of (Element 1) an attenuation amount depending on a distance (D0, RR2(=RR1))+(Element 2) a material constant (for example, an attenuation amount) of the concrete structure CC1+(Element 3) a material constant (for example, an attenuation amount) of the concrete structure CC2+(Element 4) a material constant (for example, an attenuation amount) of the wood WD1. The distance (D0, RR2) indicates a minimum value of a distance between the transmission point D0 and the position RR2 (that is, a distance between the transmission point D0 and the position RR2 arranged on a straight line).

The (Element 1) can be calculated by a known radio wave attenuation amount formula based on the distance, and is stored in advance in the program 7a of the HDD 7. For the (Element 2), (Element 3), and (Element 4), data (an example of the scattering body data) of material constants (for example, default values) corresponding to the concrete structures and the wood serving as examples of the scattering bodies may be included in the analysis basic data 7b in advance, and the material constant data may be received in advance from an external device (not shown) communicatively connected to the radio wave environment display device 100, stored in the HDD 7, and read out whenever necessary. Based on data of the map MP1 included in the analysis basic data 7b, the radio wave environment display device 100 can recognize what kind of scattering body exists (is arranged) on routes from the transmission point D0 to the positions RR1, RR2 designated by the user operation.

Figure 10:
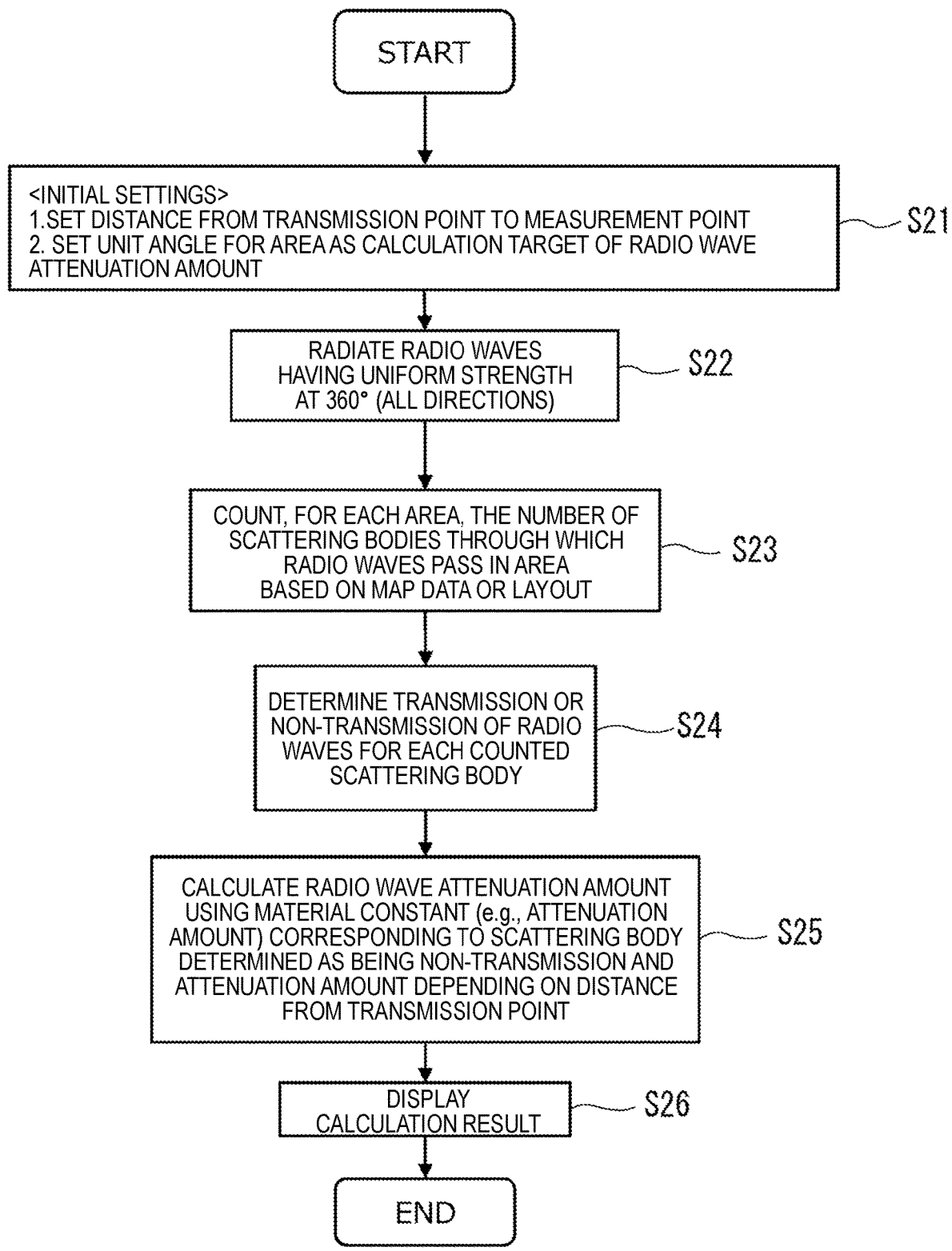
FIG. 10 is a flowchart illustrating a third example of the operation procedure of the radio wave environment analysis at the point in the model area shown in FIG. 2.

FIG. 10 is a flowchart illustrating a third example of the operation procedure of the radio wave environment analysis at the point in the model area shown in FIG. 2. The operation procedure shown in FIG. 10 is executed by, for example, the processor 1 of the radio wave environment display device 100. In the third example of the analysis, in order to speed up the analysis of the radio wave environment display device 100, when a position of the observation point desired to be observed by the user from the transmission point D0 is designated, the radio wave attenuation amount is calculated according to a distance from the transmission point D0 to the observation point located within a range of a predetermined angle and a type of the scattering body.

In FIG. 10, various parameters are initialized on the radio wave environment display device 100 by a user operation (S21). Specifically, as the various parameters, the radio wave environment display device 100 sets a position of the transmission point D0 and a distance of the observation point desired to be observed by the user from the transmission point D0, and then sets a unit angle (an example of a predetermined angle, for example, 1°) that determines an area for which the radio wave attenuation amount is calculated.

The radio wave environment display device 100 simulates (simulates) transmission (radiation) of the radio waves WV1 having uniform strength (for example, 0 dBm) from the transmission point D0 to 360° (that is, in all directions) (S22). The radio wave environment display device 100 counts the number of scattering bodies through which the radio waves WV1 pass in the area based on the data of the map MP1 of such as outdoors or data of the layout of such as indoors included in the analysis basic data 7b (S23).

The radio wave environment display device 100 determines transmission or non-transmission of the radio waves WV1 for each scattering body counted in step S23 (S24). For example, the radio wave environment display device 100 determines that the scattering body is non-transmissive when the scattering body is a metal body and determines that the scattering body is transmissive when the scattering body is not a metal body.

The radio wave environment display device 100 calculates the radio wave attenuation amount for each area by using material constants (for example, the attenuation amount of (Element 2) to (Element 4)) corresponding to the scattering bodies which are determined to be non-transmissive in step S24 using the analysis basic data 7b, and the attenuation amount depending on the distance from the transmission point D0 (for example, with reference to (Element 1)) (S25). In step S25, the radio wave environment display device 100 performs the processing of steps S23 to S25 while scanning every unit angle (for example, 1°) of all directions of 360°.

After step S25, the radio wave environment display device 100 terminates the radio wave environment analysis at the point in the area of the map MP1. Further, the radio wave environment display device 100 displays, on the display 6, an analysis result (not shown) of the radio wave environment analysis at the point in the area of the map MP1 (S26).

As described above, the radio wave environment display device 100 according to Embodiment 1 analyzes a radio wave environment corresponding to transmission of radio waves of predetermined strength, (for example, 0 dBm) from a wireless transmitter arranged at the transmission point D0 in the area. The radio wave environment display device 100 counts, in the processor 1, the number of one or more scattering bodies located within a range of a predetermined angle (for example, 1°) from the arrangement position of the wireless transmitter (that is, the transmission point D0). The radio wave environment display device 100 reads out, from the HDD 7 (an example of the memory), the scattering body data in which the type of each of the scattering bodies of the counted number and the radio wave attenuation amount corresponding to the type are associated with each other. When the radio waves of predetermined strength are transmitted from the wireless transmitter in all directions, the radio wave environment display device 100 calculates a radio wave attenuation amount at a position which is located within the range of a predetermined angle and is away from the arrangement position by a designated distance, based on the count result of the scattering bodies positioned within the range of a predetermined angle and the scattering body data.

Therefore, the radio wave environment display device 100 can analyze the radio wave environment, for a wide area such as outdoors (for example, an area of 25 km² or more shown in the map MP1) in a position of each predetermined angle that is away from the transmission point D0 by a distance designated by the user, easily and at a higher speed, so that the radio wave environment display device 100 can assist in visualizing the radio wave environment at a higher speed. For example, even in a case where the wireless transmitter located at the transmission point D0 moves in a moving body (for example, a vehicle), or the like, the radio wave environment display device 100 can similarly analyze the radio wave environment simply and at a higher speed according to the third example of the analysis, so that user convenience can be improved.

Background of Contents of Embodiment 2

In the related art including IMAI, it has been disclosed to display the analysis result of the radio wave environment for the area (that is, the simulation result of the radio wave environment at a point in the area). However, the analysis result to be displayed does not always match a user intention of confirming the analysis result, it is difficult to improve the user convenience in a point of satisfying the need of the user to check in more detail in a specific region or flow line.

Embodiment 2

Therefore, in the following Embodiment 2, an example of a radio wave environment display device and a radio wave environment display method that assist in efficiently extracting and visualizing an analysis result on a region or a flow line desired to be observed by a user when an analysis of a radio wave environment performed for a wide area is displayed will be described. Since a configuration of the radio wave environment display device according to Embodiment 2 is the same as that of the radio wave environment display device 100 according to Embodiment 1, the same components will be denoted by the same reference numerals, the description thereof will be simplified or omitted, and different contents will be described.

Figure 11:
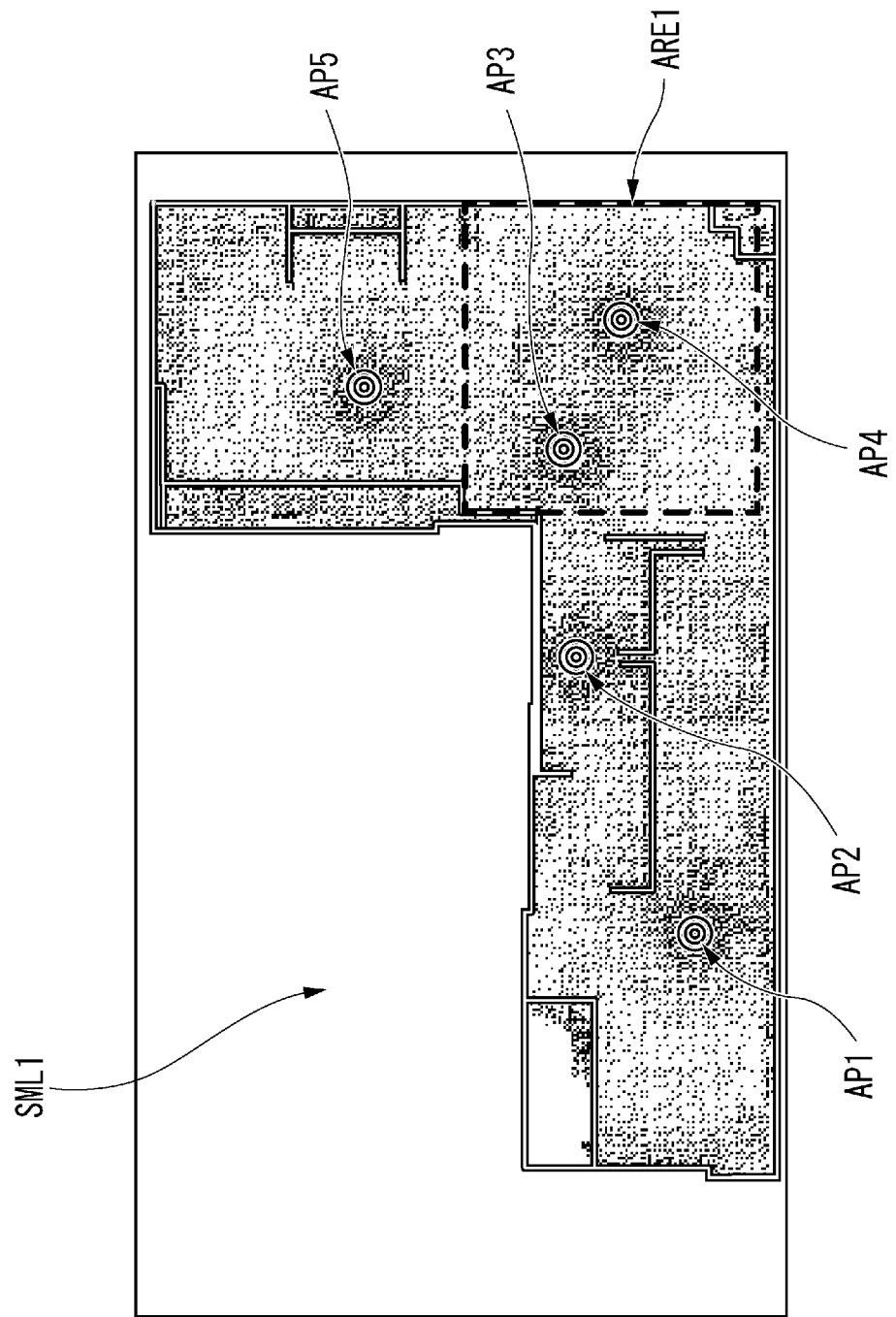
FIG. 11 is a diagram illustrating an example of a visualization result of a radio wave environment targeted in a shopping mall in which a plurality of access points are arranged and an example of an extraction range designated by a user in a radio wave environment display device according to Embodiment 2.
Figure 12:
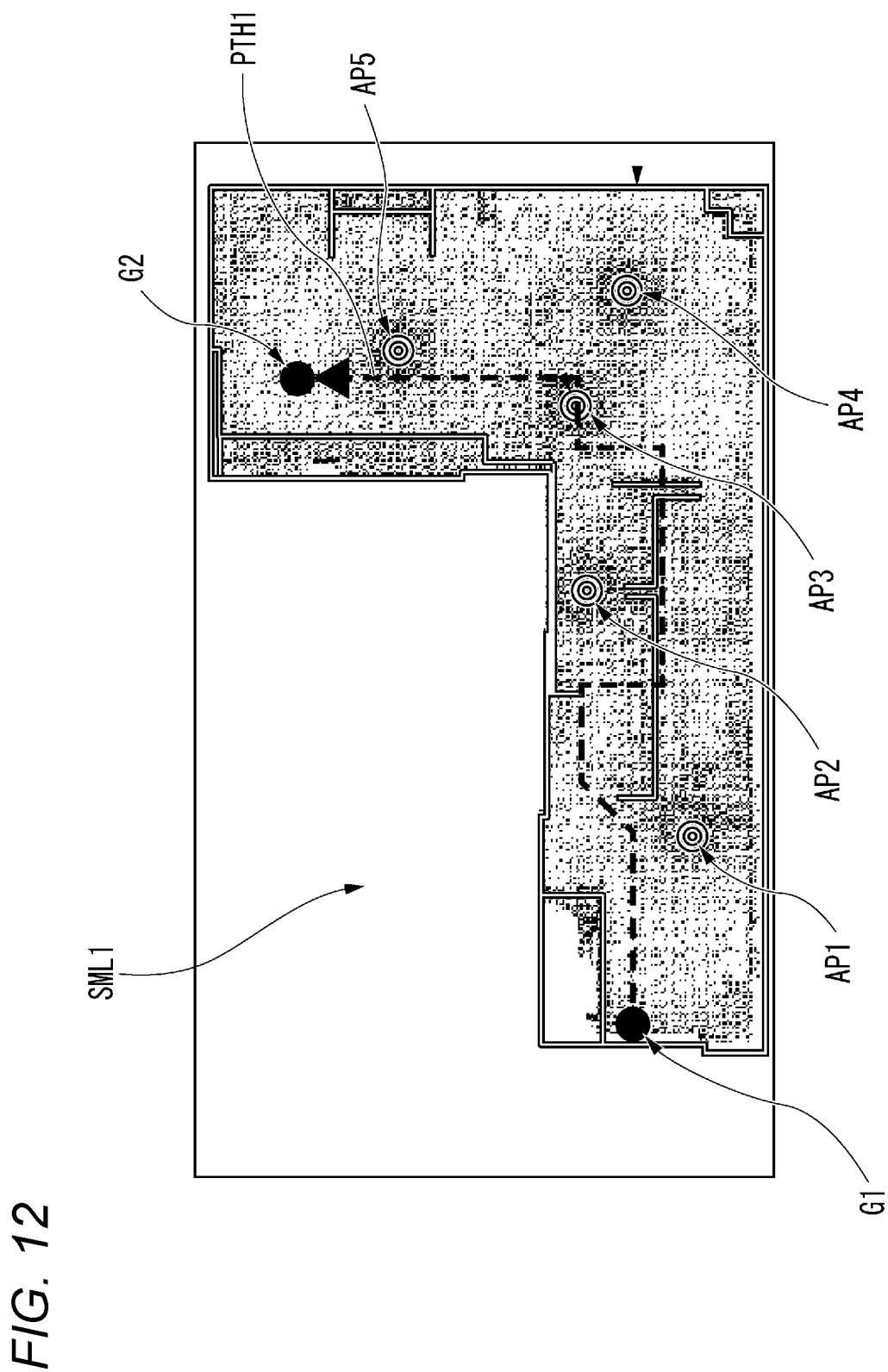
FIG. 12 is a diagram illustrating an example of a visualization result of a radio wave environment targeted in a shopping mall in which a plurality of access points are arranged and an example of a flow line designated by a user in the radio wave environment display device according to Embodiment 2.

FIG. 11 is a diagram illustrating an example of a visualization result of a radio wave environment targeted in a shopping mall SML1 in which a plurality of access points AP1, AP2, AP3, AP4, AP5 are arranged and an example of an extraction range AREA1 designated by a user in the radio wave environment display device 100 according to Embodiment 2. FIG. 12 is a diagram illustrating an example of a visualization result of a radio wave environment targeted in the shopping mall SML1 in which the plurality of access points AP1, AP2, AP3, AP4, AP5 are arranged and an example of a flow line PTH1 designated by a user in the radio wave environment display device 100 according to Embodiment 2.

In Embodiment 2, the radio wave environment display device 100 analyzes a radio wave environment according to, for example, the method described in Embodiment 1 by setting a wide area targeted for the radio wave environment analysis as the shopping mall SML1, and displays the analysis result of the analysis on the display 6. The displayed analysis result is shown in FIG. 11 or 12.

As shown in FIG. 11, when the user performs an operation of selecting an extraction range ARE1 and a time zone with a mouse 5 in the shopping mall SML1, the radio wave environment display device 100 generates and extracts an analysis result (for example, an example of an electric field strength distribution or a cumulative probability distribution, and partial radio wave environment distribution data) at a point within the selected extraction range ARE1 in the selected time zone in response to the operation, and displays the analysis result on the display 6. Even if the user does not select the extraction range ARE1 using the mouse 5, the radio wave environment display device 100 may sequentially select a random extraction range within the shopping mall SML1 every predetermined time according to a selection condition of selecting a predetermined extraction range, generate and extract an analysis result (for example, an example of an electric field strength distribution or a cumulative probability distribution, and partial radio wave environment distribution data) at a point within the selected extraction range, and display the analysis result on the display 6.

As shown in FIG. 12, when the user performs an operation of selecting the flow line PTH1 from a start point G1 to an end point G2 and a time zone with the mouse 5 in the shopping mall SML1, the radio wave environment display device 100 generates and extracts an analysis result (for example, an example of an electric field strength distribution or a cumulative probability distribution, and partial radio wave environment distribution data) at a point within the selected flow line PTH1 in the selected time zone in response to the operation, and displays the analysis result on the display 6. Even if the user does not select the flow line PTH1 using the mouse 5, the radio wave environment display device 100 may sequentially select a random flow line within the shopping mall SML1 every predetermined time according to a selection condition of selecting a predetermined flow line, generate and extract an analysis result (for example, an example of an electric field strength distribution or a cumulative probability distribution, and partial radio wave environment distribution data) at a point on the selected flow line, and display the analysis result on the display 6.

In this way, the radio wave environment display device 100 according to Embodiment 2 acquires, in the processor 1, radio wave environment data obtained by associating, with position information within an area (for example, the shopping mall SML1) having a plurality of observation points, an analysis result based on an analysis of the radio wave environment corresponding to transmission of radio waves from at least one wireless transmitter (for example, the access points AP1, AP2, AP3, AP4, AP5) positioned within the area; and stores the radio wave environment data into HDD7 (an example of a memory). The radio wave environment display device 100 selects a region that is a part of the area, extracts partial radio wave environment data corresponding to the selected part, and outputs predetermined radio wave environment distribution data based on the extracted partial radio wave environment data on the display 6.

Therefore, when the analysis of the radio wave environment performed for the wide area (for example, the shopping mall SML1) is displayed, the radio wave environment display device 100 can assist in efficiently extracting and visualizing an analysis result of a part of the shopping mall SML1 (for example, a region or a flow line showing an extraction range) desired to be observed by the user and selected by the user operation or the random selection. Therefore, since the radio wave environment display device 100 can visually present the analysis result of the radio environment in a part of the shopping mall SML1 to the user, it is possible to promote the user to determine, for example, whether or not there is a difference with a radio wave environment assumed by the user, and to improve the user convenience.

The radio wave environment display device 100 includes the mouse 5 or the keyboard 4 (an example of an operation input unit) through which a user operation is input, and extracts the partial radio wave environment data corresponding to the designated part in response to the designation operation of designating a part of the area by the user. As a result, the radio wave environment display device 100 can visually display the analysis result that satisfies the need for the user to check in more detail in a specific region or flow line of the shopping mall SML1, and thus the user convenience can be improved.

A part of the area is a region that is a part of the area (for example, the extraction range ARE1) including the point where the wireless transmitters (for example, the access points AP3, AP4) are arranged. Therefore, the radio wave environment display device 100 can visually present to the user the arrangement positions of the access points AP3, AP4 in the extraction range ARE1 including the access points AP3, AP4 and the analysis result of the radio wave environment within the extraction range ARE1. Therefore, the user can easily confirm, for example, whether or not the arrangement positions of the access points AP3, AP4 are appropriate arrangement positions in the shopping mall SML1.

Further, a part of the area is a flow line of one or more persons passing through a point where a wireless transmitter (for example, the access points AP1, AP2, AP3, AP5) is arranged or a position near the point. Therefore, the radio wave environment display device 100 can visually present a relationship between a layout of stores or the like on the flow line through which shoppers pass in the shopping mall SML1 and the arrangement positions of the access points AP1, AP2, AP3, AP5 in the flow line PTH1 passing through the points where the access points AP1, AP2, AP3, AP5 are arranged or positions near the points to the user based on the analysis result of the radio wave environment. Therefore, the user can easily confirm, for example, whether or not the arrangement positions of the access points AP1, AP2, AP3, AP5 are appropriate arrangement positions in the relationship with the layout of the stores or the like in the shopping mall SML1.

Figure 13:
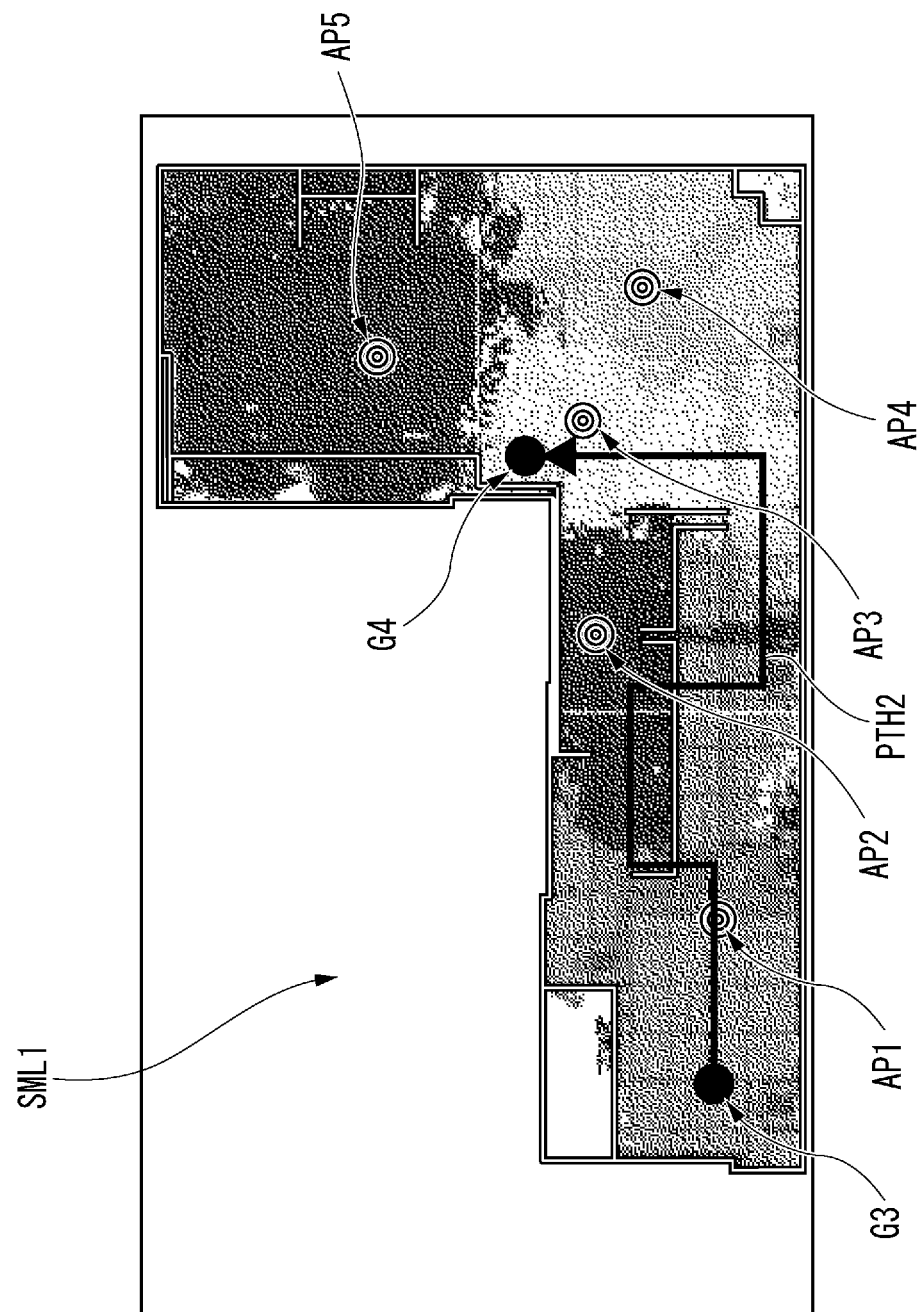
FIG. 13 is a diagram illustrating respective coverage areas of the plurality of access points arranged in the shopping mall shown in FIG. 11 and an example of a flow line designated by a user.
Figure 14:
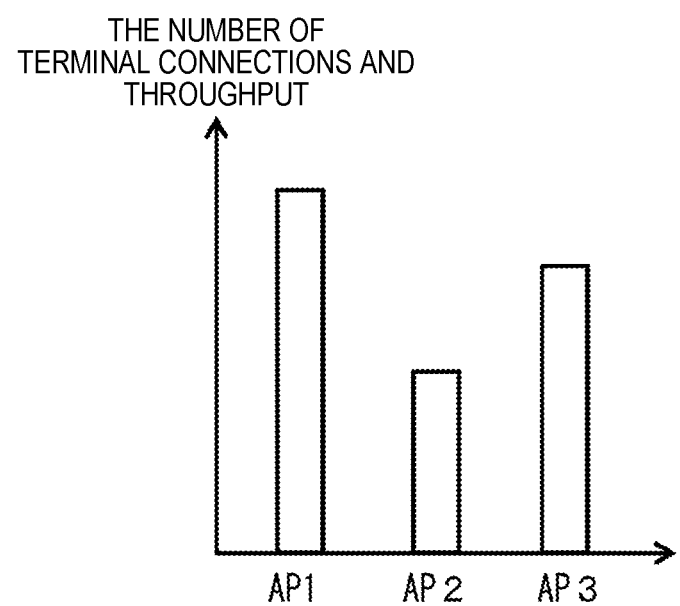
FIG. 14 is a graph illustrating a transition example of the number of terminal connections or throughput at each of the access points on the flow line shown in FIG. 13.

FIG. 13 is a diagram illustrating respective coverage areas of the plurality of access points AP1, AP2, AP3, AP4, AP5 arranged in the shopping mall SML1 shown in FIG. 11 and an example of a flow line PTH2 designated by a user. FIG. 14 is a graph illustrating a transition example of the number of terminal connections or throughput at each of the access points on the flow line PTH2 shown in FIG. 13. The shopping mall SML1 shown in FIG. 13 is the same as the shopping mall SML1 shown in FIG. 11 or FIG. 12.

When the user performs an operation of selecting the flow line PTH2 from the start point G3 to the end point G4 and a time zone desired to be observed using the mouse 5, the radio wave environment display device 100 extracts an analysis result (for example, an example of partial radio wave environment distribution data) at a point within the selected flow line PTH2 in the selected time zone in response to the operation. The radio wave environment display device 100 uses the extracted analysis result to analyze how many wireless terminals (for example, smart phones owned by shoppers) are connected to the access points on the flow line PTH2 and which access point are connected in the selected time zone, or analyze throughput that can be provided to each terminal based on the connection with the access point. The radio wave environment display device 100 displays a graph of the analysis result (see FIG. 14) on the display 6.

In FIG. 14, a transition of the number of terminal connections or throughput at each of the access points AP1, AP2, AP3 arranged on the flow line PTH2 or a vicinity position thereof in the time zone designated by the user operation is shown in a bar graph.

Figure 15:
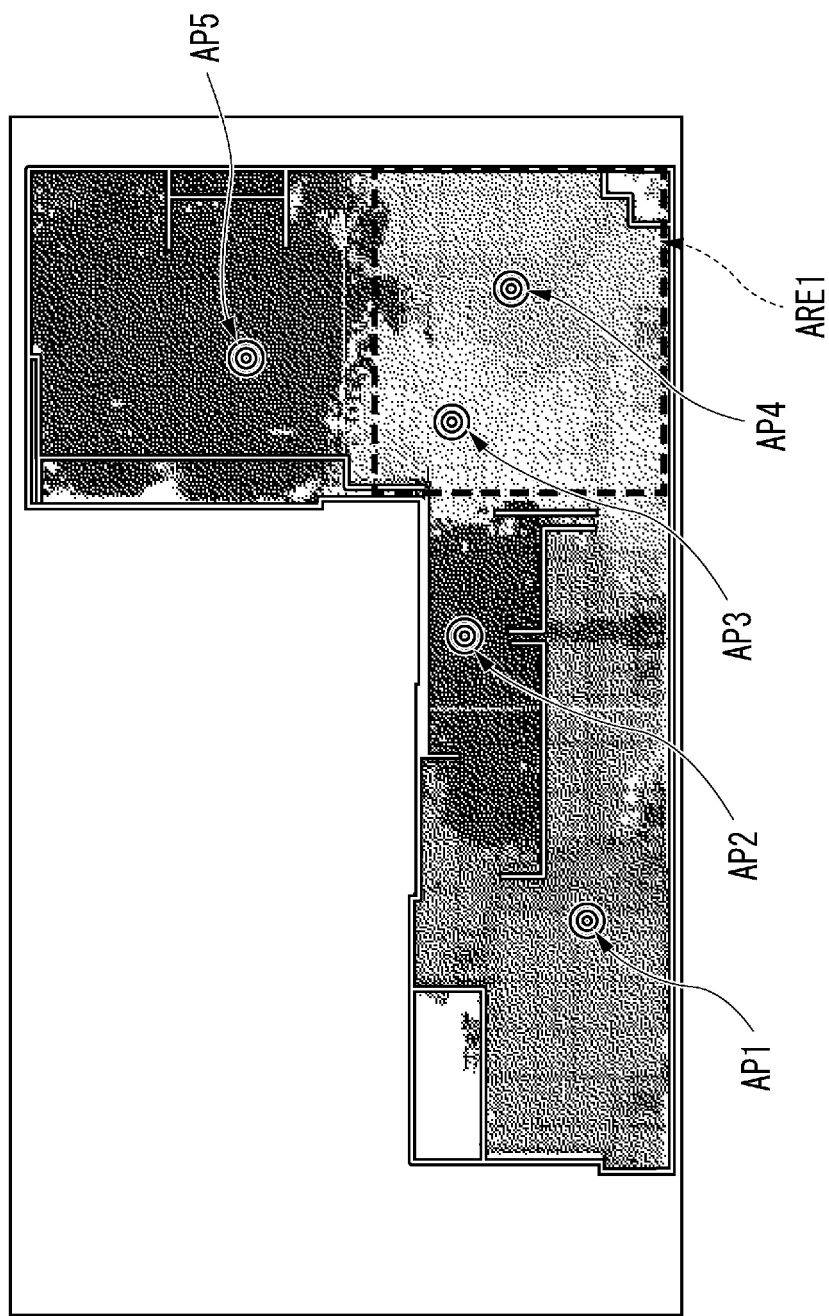
FIG. 15 is a diagram illustrating respective coverage areas of the plurality of access points arranged in the shopping mall shown in FIG. 11 and an example of an extraction range designated by a user.
Figure 16:
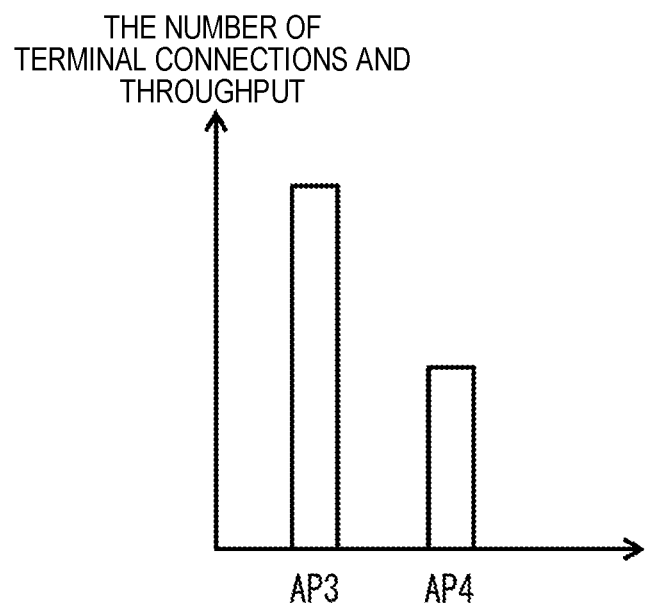
FIG. 16 is a graph illustrating a transition example of the number of terminal connections or throughput at each of the access points in the extraction range shown in FIG. 15.

FIG. 15 is a diagram illustrating respective coverage areas of the plurality of access points arranged in the shopping mall shown in FIG. 11 and an example of an extraction range designated by a user. FIG. 16 is a graph illustrating a transition example of the number of terminal connections or throughput at each of the access points in the extraction range shown in FIG. 15. The shopping mall SML1 shown in FIG. 15 is the same as the shopping mall SML1 shown in FIG. 11 or FIG. 12.

When the user performs an operation of selecting the extraction range ARE1 and a time zone desired to be observed using the mouse 5, the radio wave environment display device 100 extracts an analysis result (for example, an example of partial radio wave environment distribution data) at a point within the selected extraction range ARE1 in the selected time zone in response to the operation. The radio wave environment display device 100 uses the extracted analysis result to analyze how many wireless terminals (for example, smart phones owned by shoppers) are connected to the access points at the point within the extraction range ARE1 and which access point are connected in the selected time zone, or analyze throughput that can be provided to each terminal based on the connection with the access point. The radio wave environment display device 100 displays a graph of the analysis result (see FIG. 16) on the display 6.

In FIG. 16, a transition of the number of terminal connections or throughput at each of the access points AP3, AP4 arranged in the extraction range ARE1 in the time zone designated by the user operation is shown in a bar graph.

Thus, the radio wave environment display device 100 according to Embodiment 2 analyzes, based on the analysis result (an example of partial radio wave environment data) extracted in the predetermined period (for example, the time zone selected by the user), data indicating a status of a wireless terminal that can be connected to a wireless transmitter (access point) corresponding to the part in the predetermined period, and outputs the analysis result to the display 6. Accordingly, the radio wave environment display device 100 can associate the arrangement positions of one or more access points arranged in or near the flow line PTH2 or the extraction range ARE1 in the time zone selected by the user with the analysis result of the radio wave environment (for example, the number of terminal connections or the throughput), and visually present the arrangement positions and the analysis result to the user. Therefore, the user can easily confirm, for example, whether the arrangement position of each access point arranged in the shopping mall SML1 is a position where a good communication environment for wireless terminals of such as shoppers in the shopping mall SML1 can be provided.

Modification of Embodiment 2

In a display example of the analysis result of the radio wave environment described in Embodiment 2, for example, as shown in FIG. 11 or FIG. 12, the strength of the two-dimensional reception quality (for example, the reception power) in a plan view or perspective view (not shown) is classified and displayed by color or the like. However, in the display example, in a case where the heights of the positions of the observation points are different, it is difficult to display the analysis results by distinguishing the positions of different heights. In actual measurement of the radio wave environment, a case where positions of the observation points are different for each height is also assumed, so that in the display example of Embodiment 2, it is not possible to visually present the analysis result at different observation points for each height.

Figure 18:
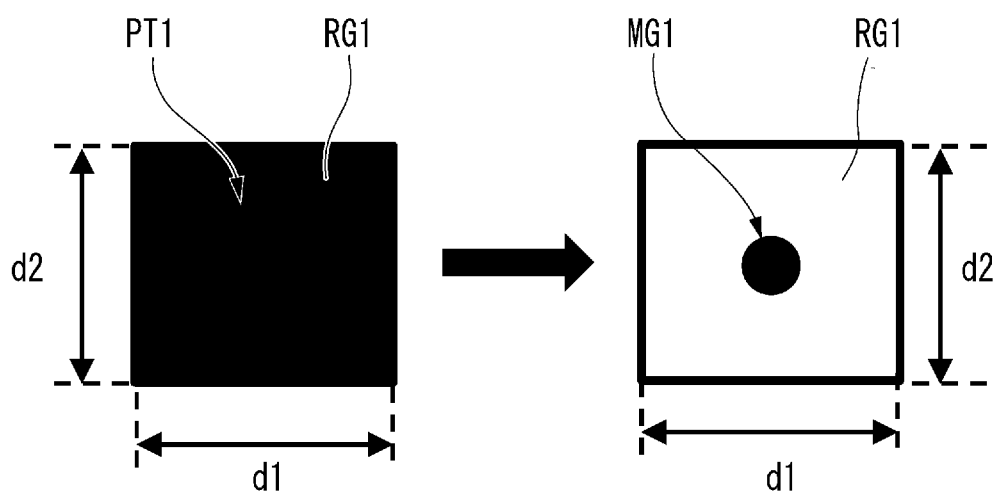
FIG. 18 is a diagram schematically illustrating an example of an operation of visualizing the radio wave environment for each height.

In a modification of Embodiment 2, the radio wave environment display device 100 does not show the analysis result at the observation point in two-dimensional color classification in either plan view or perspective view (for example, with reference to a left side in FIG. 18), but shows the analysis results at the same observation point as a three-dimensional index such as a sphere or polyhedron (for example, with reference to a right side in FIG. 18). FIG. 18 is a diagram illustrating an example of an outline of an operation of visualizing the radio wave environment for each height.

As shown on the left side of FIG. 18, a region RG1 as an example of the sub-region is a region of a rectangle or a square having a distance d1*distance d2 (*: an operator indicating multiplication), and is a region having a constant area including an observation point (for example, a center position of the region RG1). The analysis result of the radio wave environment in the region RG1 (for example, the strength of the reception power) is an average value of the strength of the reception power at respective points in the region RG1, and, for example, is shown by a two-dimensional pattern PT1 filled with red. However, when the analysis result is shown by the pattern PT1 on the display 6, as described above, in a case where the strength of the reception power differs for each height even at the same observation point, the different strength of the reception power is not visually reflected and displayed.

The radio wave environment display device 100 according to the modification of Embodiment 2 displays the average value of the strength of the reception power in the region RG1 having the same area on the display 6 by using, for example, a three-dimensional sphere MG1 painted in red, as shown on the right side of FIG. 18. This sphere MG1 has an occupation rate of a portion smaller than the area of the region RG1. The radio wave environment display device 100 omits displaying the strength of the reception power in a display part other than the display part of the sphere MG1 in the region RG1 (in other words, displayed in a transparent color).

Figure 17:
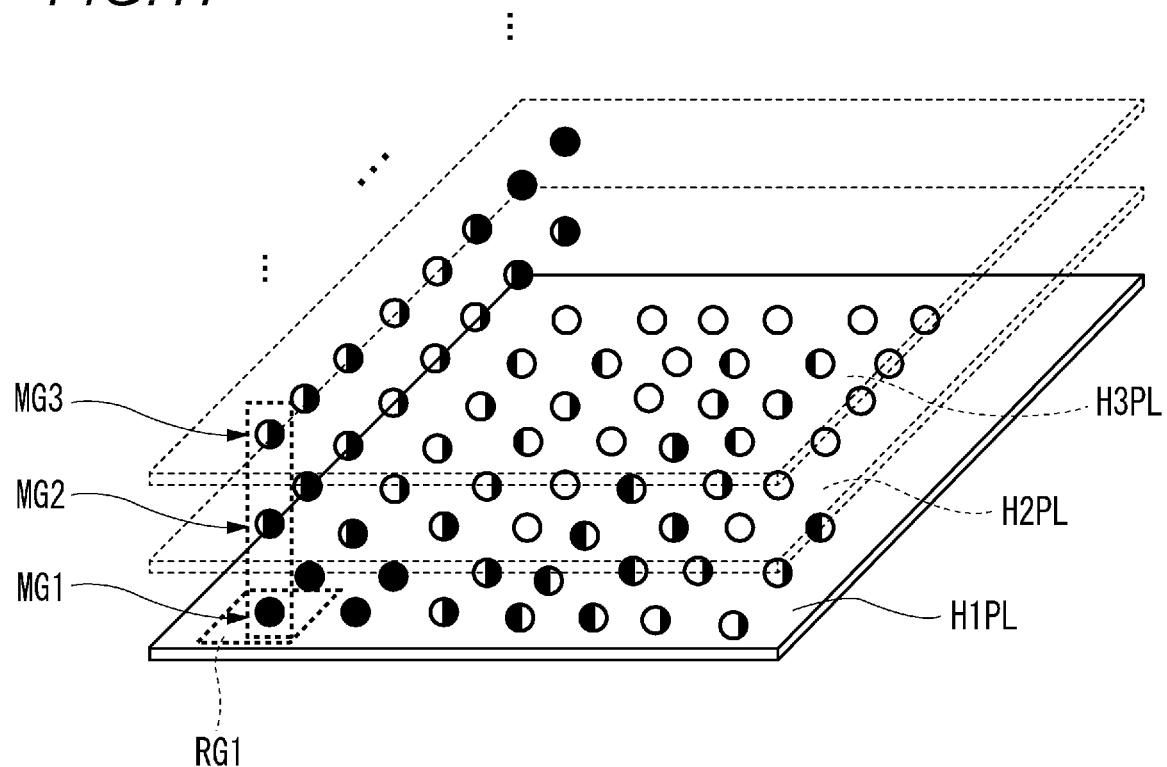
FIG. 17 is a diagram illustrating an example of a visualization result of a radio wave environment shown for each height from a floor surface in a radio wave environment display device according to a modification of Embodiment 2.

FIG. 17 is a diagram illustrating an example of a visualization result of a radio wave environment shown for each height from a floor surface in the radio wave environment display device 100 according to the modification of Embodiment 2. A floor surface H1PL is, for example, a floor surface (ground) of the area that is a target of the radio wave environment analysis. Virtual planes H2PL, H3PL, . . . shown by dotted lines in FIG. 17 are two-dimensional virtual planes indicating positions above the floor surface H1PL by a predetermined distance (in other words, positions at different heights from the floor surface). As shown in FIG. 17, the radio wave environment display device 100 according to the modification of Embodiment 2 can display not only the analysis result of the radio wave environment at a height of the floor surface H1PL on the display 6, but also the analysis results of the radio wave environment at heights of the virtual planes H2PL, H3PL, . . . on the display 6 by arranging and overlapping the analysis results on a sphere (with reference to the sphere MG1 shown in FIG. 17).

For example, in the same region RG1 as the region RG1 shown in FIG. 18, the strength of the radio wave reception power on the floor surface H1PL, the strength of the radio wave reception power on the virtual plane H2PL, and the strength of the radio wave reception power on the virtual plane H3PL are respectively shown by spheres MG1, MG2, MG3 of different colors. That is, the strength of the radio wave reception power on the floor surface H1PL, the strength of the radio wave reception power on the virtual plane H2PL, and the strength of the radio wave reception power on the virtual plane H3PL are different, so that the radio wave environment display device 100 can visually present the analysis results of the radio wave environment, which are different for each height.

As described above, the radio wave environment display device 100 according to the modification of the Embodiment 2 divides, for example, partial radio wave environment data in an extraction range or a flow line selected by a user operation into partial radio wave environment data for each of a plurality of sub regions (for example, the region RG1) obtained by dividing a part into a plurality of regions each having a predetermined area, and displays the partial radio wave environment data corresponding to the sub-region obtained by dividing on a sphere MG1 or the like having an area smaller than the predetermined area (with reference to FIG. 17). Whether the extraction range is selected or the flow line is selected, the predetermined area is a minute area that constitutes the area of the extraction range or the flow line, and the same applies hereinafter. As a result, the radio wave environment display device 100 can visually present the analysis result of the radio wave environment different for each height, and even when the analysis result of the radio wave environment at a point in the area for each height is displayed in an overlapping manner, deterioration of the visibility of the analysis result can also be effectively prevented.

Further, the radio wave environment display device 100 according to the modification of the Embodiment 2 divides, for example, partial radio wave environment data in an extraction range or a flow line selected by a user operation into partial radio wave environment data for each of a plurality of sub regions (for example, the region RG1) obtained by dividing a part into a plurality of regions each having a predetermined area, and displays the partial radio wave environment data corresponding to the sub-region obtained by dividing on a cone (not shown) or the like having an area smaller than the predetermined area. In this way, the radio wave environment display device 100 can visually present not only the strength of the reception power as the analysis result of the radio wave environment different for each height, but also an arrival direction of the radio waves in a direction from a pointed shape of such as a cone toward a bottom surface of the cone. Further, the radio wave environment display device 100 can prevent deterioration of the visibility of the analysis result even when the analysis result of the radio wave environment at a point in the area for each height is displayed in an overlapping manner.

Although various embodiments have been described above with reference to the drawings, it is needless to say that the present disclosure is not limited to such examples. It will be apparent to those skilled in the art that various alterations, modifications, substitutions, additions, deletions, and equivalents can be conceived within the scope of the claims, and it should be understood that they also belong to the technical scope of the present disclosure. Each component in the various embodiments described above may be combined freely in the range without deviating from the spirit of the invention.

The present application is based on a Japanese Patent Application (Patent Application No. 2018-044719) filed on Mar. 12, 2018, the contents of which are incorporated herein by reference.

The present disclosure is useful as a radio wave environment analysis device and a radio wave environment analysis method that assist in efficiently analyzing a radio wave environment for a wide area and visualizing the radio wave environment at a higher speed.

The invention claimed is:

1. A radio wave environment analysis device configured to analyze a radio wave environment corresponding to a radio wave transmitted from a wireless transmitter arranged within an area comprising a plurality of observation points, the radio wave environment analysis device comprising:
    a processor configured to analyze the radio wave environment using a scattering body having a volume of an initial value or higher; and
    a memory configured to store the radio wave environment at each of the plurality of observation points based on the analysis,
    wherein the processor is configured to:
        analyze the radio wave environment using a scattering body having a volume reduced by a first predetermined value, and
        terminate the analysis of the radio environment if a difference between a first radio wave environment at each of the plurality of observation points and a second radio wave environment at each of the plurality of observation points is equal to or lower than a second predetermined value, the first radio wave environment obtained based on an analysis using the scattering body before the volume is reduced, the second radio wave environment obtained based on an analysis using the scattering body after the volume is reduced.

2. A radio wave environment analysis method to be performed in a radio wave environment analysis device configured to analyze a radio wave environment corresponding to a radio wave transmitted from a wireless transmitter arranged within an area comprising a plurality of observation points, the radio wave environment analysis method comprising:
 analyzing the radio wave environment using a scattering body having a volume of an initial value or higher;
 storing the radio wave environment at each of the plurality of observation points based on the analysis into a memory;
 analyzing the radio wave environment using a scattering body having a volume reduced by a first predetermined value; and
 terminating the analysis of the radio environment if a difference between a first radio wave environment at each of the plurality of observation points and a second radio wave environment at each of the plurality of observation points is equal to or lower than a second predetermined value, the first radio wave environment obtained based on an analysis using the scattering body before the volume is reduced, the second radio wave environment obtained based on an analysis using the scattering body after the volume is reduced.

3. A radio wave environment analysis device configured to analyze a radio wave environment corresponding to a radio wave of a predetermined strength transmitted from a wireless transmitter arranged within an area, the radio wave environment analysis device comprising:
 a processor configured to divide the area into a plurality of block areas comprising a first block area, the first block area in which the wireless transmitter is arranged, and analyze the radio wave environment using a scattering body located in the first block area; and
 a memory configured to store an analysis result of the radio wave environment in the first block area based on the analysis,
 wherein the processor is configured to:
  virtually arrange a secondary wireless transmitter at a position where the block areas including the first block area are adjacent or overlap, the secondary wireless transmitter being configured to transmit a radio wave of the predetermined strength, and analyze the radio wave environment corresponding to the radio wave transmitted from the secondary wireless transmitter for each of the block areas other than the first block area, and
  correct the analysis of the radio wave environment corresponding to the radio wave transmitted from the secondary wireless transmitter which is performed for each of the block areas other than the first block area, based on the analysis result of the radio wave environment in the first block area.

4. A radio wave environment analysis method to be performed in a radio wave environment analysis device configured to analyze a radio wave environment corresponding to a radio wave of a predetermined strength transmitted from a wireless transmitter arranged within an area, the radio wave environment analysis method comprising:
 dividing the area into a plurality of block areas comprising a first block area, the first block area in which the wireless transmitter is arranged;
 analyzing the radio wave environment using a scattering body located in the first block area;
 storing an analysis result of the radio wave environment in the first block area based on the analysis into a memory;
 virtually arranging a secondary wireless transmitter at a position where the block areas including the first block area are adjacent or overlap, the secondary wireless transmitter being configured to transmit a radio wave of the predetermined strength, and analyzing the radio wave environment corresponding to the radio wave transmitted from the secondary wireless transmitter for each of the block areas other than the first block area; and
 correcting the analysis of the radio wave environment corresponding to the radio wave transmitted from the secondary wireless transmitter which is performed for each of the block areas other than the first block area, based on the analysis result of the radio wave environment in the first block area.

5. A radio wave environment analysis device configured to analyze a radio wave environment corresponding to a radio wave of a predetermined strength transmitted from a wireless transmitter arranged within an area, the radio wave environment analysis device comprising:
 a processor configured to counts the number of one or more scattering bodies located within a range of a predetermined angle from an arrangement position of the wireless transmitter; and
 a memory configured to store scattering body data in which a type of the scattering body and a radio wave attenuation amount corresponding to the type are associated with each other,
 wherein the processor is configured to:
  calculate a radio wave attenuation amount at a position which is located within the range of the predetermined angle and is away from the arrangement position by a designated distance, based on a count result of the scattering bodies located within the range of the predetermined angle and the scattering body data, if the radio wave of the predetermined strength is transmitted from the wireless transmitter in all directions.

6. A radio wave environment analysis method to be performed in a radio wave environment analysis device configured to analyze a radio wave environment corresponding to a radio wave of a predetermined strength transmitted from a wireless transmitter arranged within an area, the radio wave environment analysis method comprising:
 counting the number of one or more scattering bodies located within a range of a predetermined angle from an arrangement position of the wireless transmitter;
 reading scattering body data from a memory, the scattering body data in which a type of the scattering body and a radio wave attenuation amount corresponding to the type are associated with each other; and
 calculating a radio wave attenuation amount at a position which is located within the range of the predetermined angle and is away from the arrangement position by a designated distance, based on a count result of the scattering bodies located within the range of the predetermined angle and the scattering body data, if the radio wave of the predetermined strength from the wireless transmitter is transmitted in all directions.

* * * * *